United States Patent
Lee et al.

(10) Patent No.: US 11,693,172 B2
(45) Date of Patent: Jul. 4, 2023

(54) BACKLIGHT UNIT, DISPLAY APPARATUS INCLUDING THE SAME, AND MANUFACTURING METHOD THEREOF

(71) Applicant: Samsung Display Co., Ltd., Yongin-si (KR)

(72) Inventors: Hongbeom Lee, Hwaseong-si (KR); Yeogeon Yoon, Suwon-si (KR); Tae Woo Lim, Cheonan-si (KR); Jangsoo Kim, Asan-si (KR); Dongwoo Kim, Seoul (KR); Min Su Kim, Hwaseong-si (KR); Keunwoo Park, Incheon (KR); Seongyeon Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 253 days.

(21) Appl. No.: 16/970,839

(22) PCT Filed: Oct. 18, 2018

(86) PCT No.: PCT/KR2018/012361
§ 371 (c)(1),
(2) Date: Mar. 11, 2021

(87) PCT Pub. No.: WO2019/198893
PCT Pub. Date: Oct. 17, 2019

(65) Prior Publication Data
US 2021/0191028 A1    Jun. 24, 2021

(30) Foreign Application Priority Data
Apr. 10, 2018 (KR) .................. 10-2018-0041758

(51) Int. Cl.
*F21V 8/00* (2006.01)
*B23K 26/402* (2014.01)

(52) U.S. Cl.
CPC .......... *G02B 6/0053* (2013.01); *B23K 26/402* (2013.01); *G02B 6/005* (2013.01); *G02B 6/0086* (2013.01)

(58) Field of Classification Search
None
See application file for complete search history.

(56) References Cited

U.S. PATENT DOCUMENTS 7,355,661 B2    4/2008  Hong
7,767,485 B2    8/2010  Ogawa et al.
(Continued)

FOREIGN PATENT DOCUMENTS

KR    10-2016-0038325    4/2016
KR    10-2016-0095998    8/2016
(Continued)

OTHER PUBLICATIONS

International Search Report dated Mar. 29, 2019, in International Application No. PCT/KR2018/012361.

*Primary Examiner* — Eric T Eide
(74) *Attorney, Agent, or Firm* — H.C. Park & Associates, PLC

(57) ABSTRACT

A display apparatus includes a light source, a display panel, a light guide member, and an optical member. The light source is configured to generate light. The display panel is configured to display an image. The light guide member includes at least one surface adjacent to the light source. The optical member is between the light guide member and the display panel. The optical member includes a low refractive layer, a first cover layer, and a light conversion layer. The low refractive layer is on a light output surface of the light guide member and includes side surfaces. The first cover layer is on the low refractive layer and surrounds at least a portion of the side surfaces of the low refractive layer. The (Continued)

light conversion layer is on the first cover layer and is configured to covert a wavelength band of incident light.

13 Claims, 22 Drawing Sheets

(56) References Cited

U.S. PATENT DOCUMENTS

| | | |
|---|---|---|
| 9,223,081 B2 | 12/2015 | Oh et al. |
| 9,618,681 B2 | 4/2017 | Cheng et al. |
| 10,078,171 B2 | 9/2018 | Lee |
| 10,120,114 B2 | 11/2018 | Jeon et al. |
| 10,267,975 B2 | 4/2019 | Chong et al. |
| 10,784,414 B2 | 9/2020 | Umehara et al. |
| 2005/0212999 A1 | 9/2005 | Yang et al. |
| 2012/0113672 A1* | 5/2012 | Dubrow ............... G02B 6/0055 |
| 2016/0209553 A1* | 7/2016 | Lee ...................... G02F 1/1339 |
| 2016/0349427 A1* | 12/2016 | Lin ........................ G02B 6/005 |
| 2017/0248748 A1* | 8/2017 | Satake ................. G02B 6/0051 |
| 2017/0277002 A1* | 9/2017 | Yamada ............ G02F 1/133621 |
| 2017/0299792 A1 | 10/2017 | Oh et al. |
| 2018/0072949 A1* | 3/2018 | Satake ..................... G02B 5/20 |
| 2020/0032137 A1* | 1/2020 | Watano ................... G02B 5/20 |
| 2020/0301207 A1 | 9/2020 | Yoshikawa et al. |

FOREIGN PATENT DOCUMENTS

| | | |
|---|---|---|
| KR | 10-2016-0128257 | 11/2016 |
| KR | 10-2016-0146275 | 12/2016 |
| KR | 10-2017-0074947 | 6/2017 |
| KR | 10-2018-0015310 | 2/2018 |
| TW | 201241536 | 10/2012 |
| TW | 201736883 | 10/2017 |
| TW | 201737522 | 10/2017 |

* cited by examiner

BACKLIGHT UNIT, DISPLAY APPARATUS INCLUDING THE SAME, AND MANUFACTURING METHOD THEREOF

CROSS-REFERENCE TO RELATED APPLICATIONS

This application is a National Stage Entry of International Application No. PCT/KR2018/012361, filed Oct. 18, 2018, and claims priority to and the benefit of Korean Patent Application No. 10-2018-0041758, filed Apr. 10, 2018, each of which is hereby incorporated by reference for all purposes as if fully set forth herein.

BACKGROUND

Field

The disclosure generally relates to a display apparatus with improved durability and display quality.

Discussion

A display apparatus is attracting attention as a next-generation advanced display element having low power consumption, good portability, and high added value. A display apparatus includes a thin film transistor for each pixel such that the on/off of voltage for each pixel can be controlled.

Meanwhile, the display apparatus may include a display panel and a backlight unit which provides light to the display panel. The backlight unit may include a light source and a light guide plate. Light generated from the light source is guided inside the light guide plate and provided to the display panel.

The above information disclosed in this section is only for understanding the background of the inventive concepts, and, therefore, may contain information that does not form prior art.

SUMMARY

Some exemplary embodiments are capable of providing a display apparatus with improved durability and display quality.

Some exemplary embodiments are capable of providing a method of manufacturing a display apparatus with improved durability and display quality.

Some exemplary embodiments are capable of providing a backlight unit with improved durability and display quality.

Additional aspects will be set forth in the detailed description which follows, and, in part, will be apparent from the disclosure, or may be learned by practice of the inventive concepts.

According to an exemplary embodiment, a display apparatus includes a light source, a display panel, a light guide member, and an optical member. The light source is configured to generate light. The display panel is configured to display images. The light guide member includes at least one surface adjacent to the light source. The optical member is between the light guide member and the display panel. The optical member includes a low refraction layer, a first cover layer, and a light conversion layer. The low refraction layer is on a light output surface of the light guide member and includes side surfaces. The first cover layer is on the low refraction layer and surrounds at least a portion of the side surfaces of the low refraction layer. The light conversion layer is on the first cover layer. The light conversion layer is configured to covert a wavelength band of incident light.

In an exemplary embodiment, the first cover layer may include a barrier layer and an adhesive layer. The barrier layer may be on an upper portion of the low refraction layer and may include an inorganic material. The adhesive layer may be between the low refraction layer and the barrier layer. The adhesive layer may increase adhesion between the low refraction layer and the barrier layer.

In an exemplary embodiment, the barrier layer may contact an upper surface of the low refraction layer, and the adhesive layer may contact at least a portion of the side surfaces of the low refraction layer.

In an exemplary embodiment, the barrier layer may include at least one of silicon oxide ($SiO_x$) and silicon nitride ($SiN_x$).

In an exemplary embodiment, the first cover layer may cover some of the side surfaces of the low refraction layer, except for a side surface adjacent to the light source.

In an exemplary embodiment, the first cover layer may cover all of the side surfaces of the low refraction layer.

In an exemplary embodiment, the optical member may further include a second cover layer on the light conversion layer and covering the light conversion layer.

In an exemplary embodiment, the second cover layer may include a same material as the first cover layer.

In an exemplary embodiment, the second cover layer may cover at least a portion of side surfaces of the light conversion layer.

In an exemplary embodiment, the optical member may further include a third cover layer on the second cover layer and including an organic material.

In an exemplary embodiment, the light conversion layer may include quantum dots.

In an exemplary embodiment, the low refraction layer may include pores.

In an exemplary embodiment, the refractive index of the low refraction layer may be greater than or equal to about 1.1 and less than or equal to about 1.3.

According to an exemplary embodiment, a manufacturing method of a display apparatus includes: forming low refraction layer patterns on a mother substrate including first regions spaced apart from each other on a plane and a second region surrounding the first regions; forming a first cover layer on the low refraction layer patterns; forming a light conversion layer on the first cover layer; and cutting the mother substrate. The low refraction layer patterns are disposed in the first regions on the plane. Cutting the mother substrate includes cutting the mother substrate along a cutting line having a closed curve, at least a portion of the cutting line being defined on the mother substrate to overlap the second region on the plane.

In an exemplary embodiment, the first cover layer may be formed to overlap the first regions and the second region on the plane.

In an exemplary embodiment, the mother substrate may be cut such that one side surface of the low refraction layer patterns is exposed to the outside.

In an exemplary embodiment, at least a portion of the cutting line may be defined on the mother substrate to overlap each of the first regions.

In an exemplary embodiment, the manufacturing method further includes depositing a second cover layer on the light conversion layer.

In an exemplary embodiment, the light conversion layer may include quantum dots.

In an exemplary embodiment, forming the low refraction layer patterns may include: applying a preliminary solution on the mother substrate to form a layer overlapping the first regions and the second region; and removing a portion of the layer of the preliminary solution on the second region.

In an exemplary embodiment, the preliminary solution may include a photoresist.

In an exemplary embodiment, the portion of the layer of the preliminary solution may be removed by an edge bead removal (EBR) process.

In an exemplary embodiment, the portion of the layer of the preliminary solution may be removed by a laser.

According to an exemplary embodiment, a manufacturing method of a display apparatus includes: forming a low refraction layer on a mother substrate including regions spaced apart from each other on a plane and a second region surrounding the first regions; forming a first cover layer on the low refraction layer; forming a light conversion layer on the first cover layer; patterning the low refraction layer, the first cover layer, and the light conversion layer; forming a second cover layer on the light conversion layer; and cutting the mother substrate. A patterned low refraction layer, a patterned first cover layer, and a patterned light conversion layer are disposed in the first regions. Cutting the mother substrate includes cutting the mother substrate along a cutting line having a closed curve, at least a portion of the cutting line being defined on the mother substrate to overlap the second region on the plane.

In an exemplary embodiment, patterning the low refraction layer, the first cover layer, and the light conversion layer may include removing respective portions of the low refraction layer, the first cover layer, and the light conversion layer overlapping the second region.

In an exemplary embodiment, the low refraction layer, the first cover layer, and the light conversion layer may be removed by a laser process.

In an exemplary embodiment, the second cover layer may be formed to overlap the first regions and the second region on the plane.

In an exemplary embodiment, a portion of the cutting line may be defined on the mother substrate to overlap the first regions.

According to an exemplary embodiment, a backlight unit includes a light source, a light guide member, and an optical member. The light source is configured to generate light. The light guide member includes at least one surface adjacent to the light source. The optical member is on the light guide member. The optical member includes a low refraction layer, a first cover layer, and a light conversion layer. The low refraction layer is on a light output surface of the light guide member and includes side surfaces. The first cover layer is on the low refraction layer and surrounds at least a portion of the side surfaces of the low refraction layer. The light conversion layer is on the first cover layer and is configured to convert a wavelength band of incident light.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF SOME EXEMPLARY EMBODIMENTS

Figure 1:
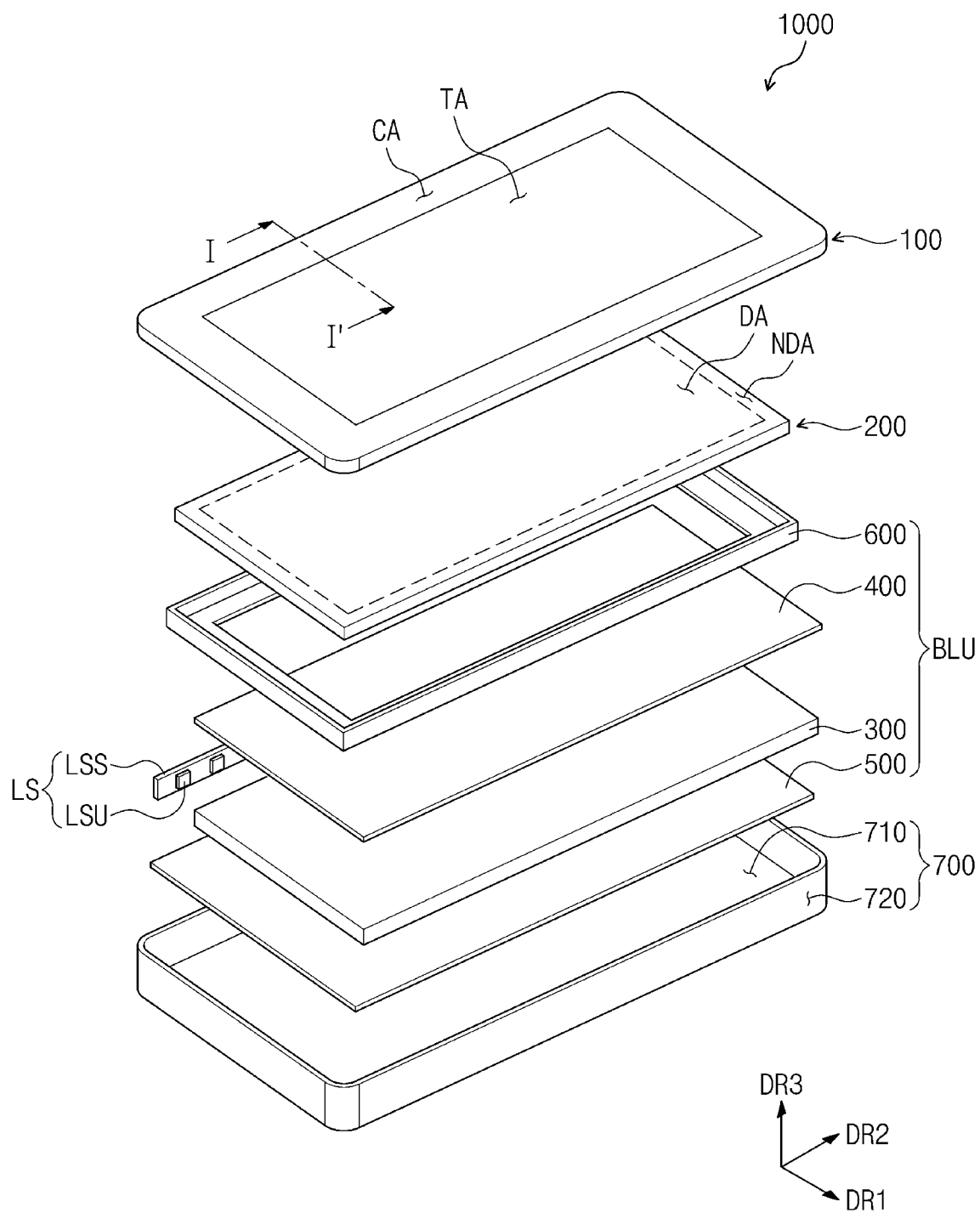
FIG. 1 is an exploded perspective view of a display apparatus according to an exemplary embodiment.

Advantages and features of the inventive concepts and methods of accomplishing the same may be understood more readily by reference to the following detailed description of exemplary embodiments and the accompanying drawings. However, the inventive concepts are embodied in many different forms and are not limited to the exemplary embodiments set forth herein. Rather, in the following description, for the purposes of explanation, numerous specific details are set forth in order to provide a thorough understanding of various exemplary embodiments. Accordingly, the inventive concepts are not limited to such embodiments, but rather to the broader scope of the accompanying claims and various obvious modifications and equivalent arrangements as would be apparent to one of ordinary skill in the art. The same reference numerals refer to like elements throughout the specification.

When an element (or elements) or a layer is referred to as being "above (or on)," or "over (or on)" the other element or layer, it indicates not only that the element or the layer is directly on the other element or the layer, but also other layers or other elements may be disposed in between. On the other hand, if an element or layer is referred to as being "directly above (or directly on)" or "directly over (or directly on)," it indicates that other elements or layers are not disposed in between. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Spatially relative terms, such as "below," "down (or beneath)," "bottom (or lower)," "upper (or above)," "top (or upper)," etc., may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings.

Although the terms "first," "second," etc. may be used herein to describe various elements, components, and/or sections, these elements, components, and/or sections are not to be limited by these terms. These terms are only used to distinguish one element, component, or section with the another element, component, or section. Thus, a first element discussed below could be termed a second element without departing from the teachings of the disclosure.

Various exemplary embodiments are described herein with reference to plan views and cross-sectional views that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Hereinafter, various exemplary embodiments will be explained in detail with reference to the accompanying drawings.

Figure 2:
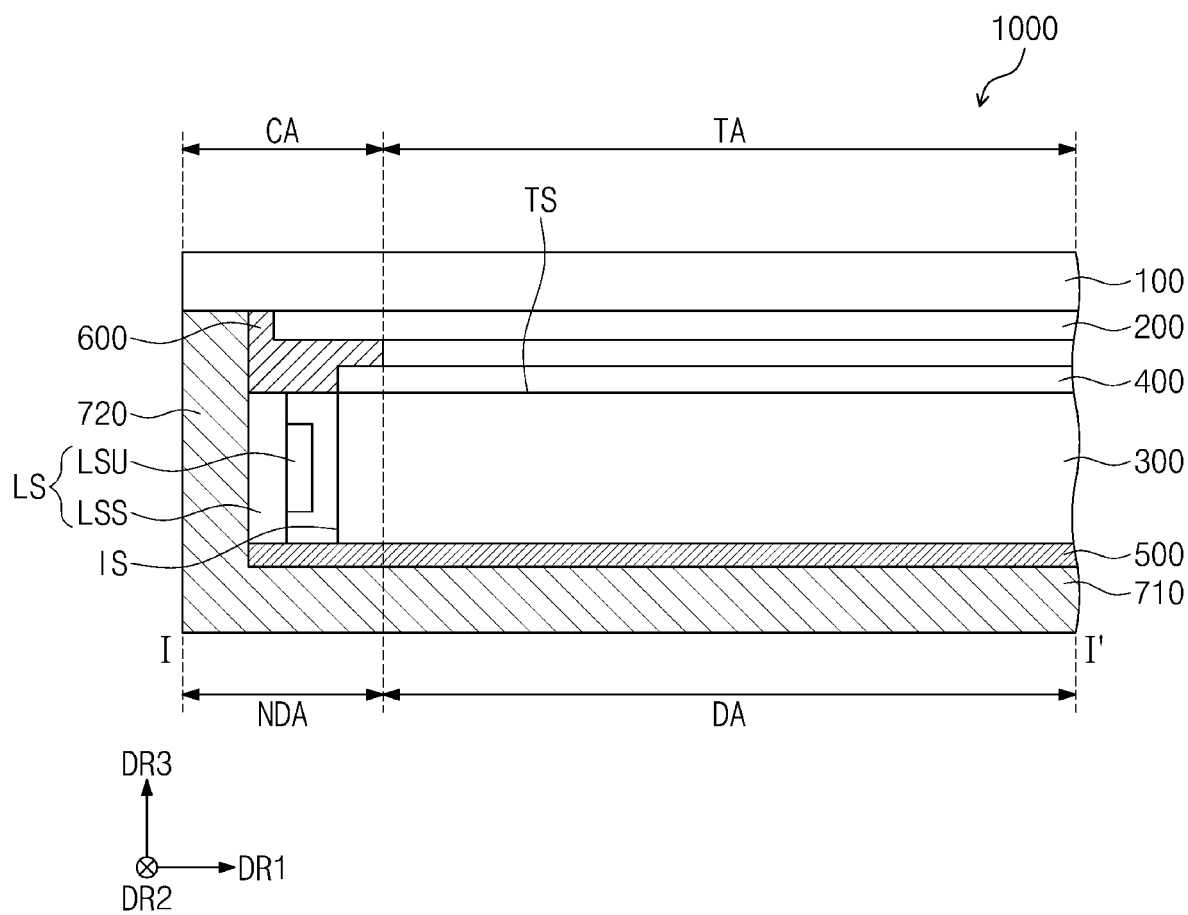
FIG. 2 is a cross-sectional view taken along sectional line I-I' shown in FIG. 1 according to an exemplary embodiment.

FIG. 1 is an exploded perspective view of a display apparatus according to an exemplary embodiment. FIG. 2 is a cross-sectional view taken along sectional line I-I' shown in FIG. 1 according to an exemplary embodiment.

Referring to FIG. 1 and FIG. 2, a display apparatus 1000 according to an exemplary embodiment has a shape of a rectangle having a short side in a first direction DR1 and a long side in a second direction DR2. However, a display apparatus 1000 according to another exemplary embodiment is not limited thereto, and may have various shapes.

The display apparatus 1000 includes a window member 100, a display member 200, a backlight unit BLU, and a receiving member 700.

For convenience of explanation, a direction in which an image is provided in the display apparatus 1000 is defined as an upper direction, and a direction opposite to the upper direction is defined as a lower direction. The upper and lower directions are parallel to a third direction DR3, which is defined as a direction perpendicular to the first direction DR1 and the second direction DR2. The third direction DR3 may be a reference direction, which distinguishes between a front surface and a rear surface of components to be described later. However, the upper direction or the lower direction is a relative concept and may be converted to another direction.

The window member 100 includes a light transmitting region TA, which transmits an image provided from the display member 200, and a light shielding region CA in which an image is not transmitted. The light transmitting region TA is disposed at the center of the display apparatus 1000 on a plane defined by the first direction DR1 and the second direction DR2. The light shielding region CA is disposed on the periphery of the light transmitting region TA, and has a shape of a frame surrounding the light transmitting region TA. However, the inventive concepts are not limited thereto. According to another exemplary embodiment, the window member 100 may include only the light transmitting region TA, in which case the light shielding region CA is omitted.

The window member 100 may be made of a material including glass, sapphire, or plastic.

The display member 200 is disposed on a lower portion of the window member 100. The display member 200 displays an image using light provided from the backlight unit BLU. That is, the display member 200 may include a light-receiving type display panel. As an example, according to an exemplary embodiment, the display member 200 may include a liquid crystal display panel.

On a plane, a surface of the display member 200, the surface on which an image is displayed, is defined as a display surface. The display surface includes a display region DA on which an image is displayed, and a non-display region NDA on which an image is not displayed. The display region DA is defined at the center of the display member 200 on the plane, and may overlap the light transmitting region TA of the window member 100.

The backlight unit BLU is disposed on a lower portion of the display member 200, and provides light to the display member 200. According to an exemplary embodiment, the backlight unit BLU may be an edge-type backlight unit. However, the inventive concepts are not limited thereto. As an example, although not shown in the drawings, a backlight unit BLU according to another exemplary embodiment may be a direct-type backlight unit.

The backlight unit BLU according to an exemplary embodiment includes a light source LS, a light guide member 300, an optical member 400, a reflecting member 500, and a mold frame 600.

The light source LS is disposed adjacent to one side surface of the light guide member 300 in the first direction DR1. However, the inventive concepts are not limited to the light source LS being disposed adjacent thereto, and the light source LS may be disposed adjacent to at least any one side surface of side surfaces of the light guide member 300.

The light source LS includes a plurality of light source units LSU and a light source substrate LSS.

The light source units LSU generate light to be provided to the display member 200, and provide the light to the light guide member 300.

According to an exemplary embodiment, the light source units LSU may generate a first light. The first light may have a first wavelength band. As an example, the first wavelength band may be about 400 nm to about 500 nm inclusive. That is, the light source units LSU may substantially generate blue light.

According to an exemplary embodiment, the light source units LSU may be in the form of a light emitting diode (LED) used a point light source. However, the inventive concepts are not limited to the type of the light source units LSU.

In addition, the inventive concepts are not limited to the number of the light source units LSU. According to another exemplary embodiment, the light source units LSU may be provided as one LED as a point light source, not as a plurality of LEDs, or may be provided as a plurality of LED groups. Also, according to another exemplary embodiment, the light source units LSU may be linear light sources.

The light source units LSU may be mounted on the light source substrate LSS. The light source substrate LSS is disposed to face one side of the light guide member 300 in the first direction DR1, and is extended in the second direction DR2. However, the inventive concepts are not particularly limited to the shape and arrangement relationship of the light source LS and the light source substrate LSS.

The light source substrate LSS may include a light source control unit (not shown) connected to the light source units LSU. The light source control unit (not shown) analyzes an image to be displayed on the display member 200 to output a local dimming signal, and may control the brightness of light generated by the light source units LSU in response to the local dimming signal. In another exemplary embodiment, the light source control unit (not shown) may be provided and may be mounted on a separate circuit board, but the position thereof is not particularly limited.

The light guide member 300 includes a material having high light transmittance in the visible light region. As an example, the light guide member 300 may include a glass material. In another exemplary embodiment, the light guide member 300 may be made of a transparent polymer resin, such as poly(methyl methacrylate) (PMMA). In an exemplary embodiment, the light guide member 300 may have a refractive index of about 1.4 to about 1.55 inclusive.

Figure 4:
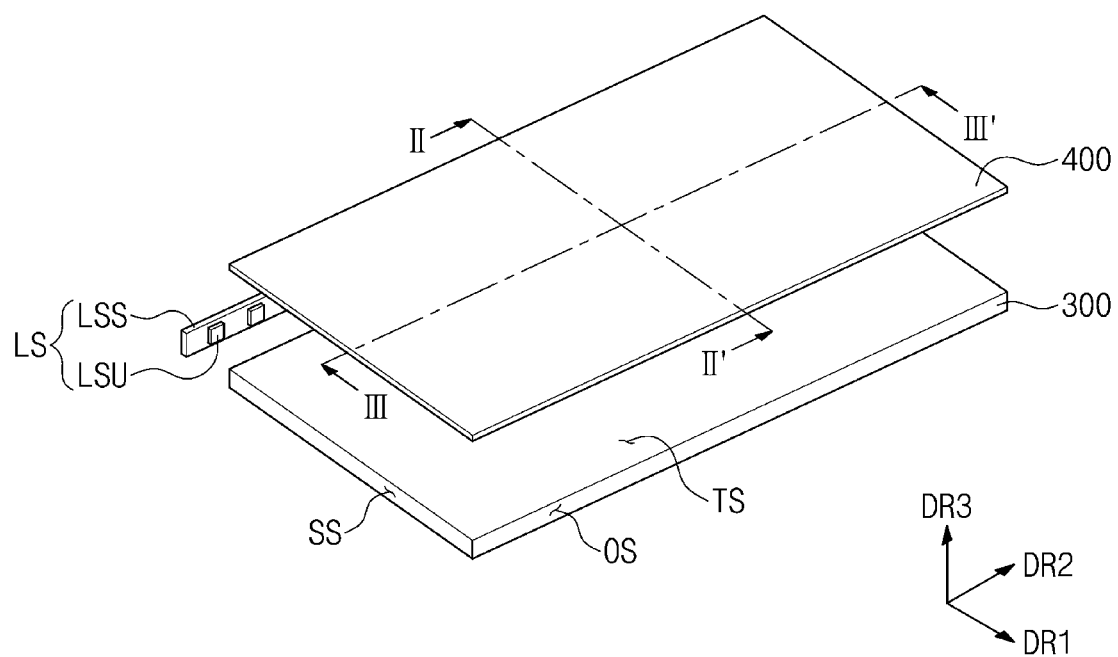
FIG. 4 is a perspective view of a light guide member and an optical member according to an exemplary embodiment.

The light guide member 300 includes a light outgoing surface TS, a bottom surface (not shown), and a plurality of side surfaces IS, SS, and OS (see FIG. 2 and FIG. 4). Of the side surfaces IS, SS, and OS, one side surface adjacent to the light source LS is defined as a light incident surface IS, and one surface facing the light incident surface IS is defined as an opposing surface OS.

Although not shown in the drawings, the light guide member 300 may include a plurality of light outgoing patterns (not shown) formed on the light outgoing surface TS or the bottom surface (not shown). The light outgoing patterns (not shown) serve to refract light incident on the light outgoing surface TS or the bottom surface (not shown) of the light guide member 300 to change the reflection angle of the light. The light outgoing patterns (not shown) may have an intaglio or embossed shape on the light outgoing surface TS or the bottom surface (not shown).

The optical member 400 is disposed on the light guide member 300. The lower surface of the optical member 400 comes in contact with the upper surface of the light guide member 300. The optical member 400 will be described in more detail below with reference to FIG. 4 to FIG. 6.

The reflecting member 500 is disposed on a lower portion of the light guide member 300. The reflecting member 500 reflects light emitted from the lower portion of the light guide member 300 in the upper direction. The reflecting member 500 includes a material that reflects light. As an example, the reflecting member 500 may include aluminum or silver.

Although not shown in the drawings, the backlight unit BLU may further include at least one optical sheet (not shown) disposed between the optical member 400 and the display member 200. When the optical sheet (not shown) is provided in plurality, the plurality of optical sheets (not shown) may include a diffusion sheet, a prism sheet, and a protective sheet. The diffusion sheet may diffuse light provided from the optical member 400. The prism sheet may be disposed on an upper portion of the diffusion sheet, and condense the light diffused by the diffusion sheet in the upper direction perpendicular to a plane. The protective sheet may protect prisms of the prism sheet from external friction. The inventive concepts are not limited to the type and number of the optical sheets (not shown).

The mold frame 600 is disposed between the display member 200 and the optical member 400. In the case of the display apparatus 1000 including the optical sheets (not shown) described above, the mold frame 600 may be disposed between the optical sheets (not shown) and the optical member 400.

According to an exemplary embodiment, the mold frame 600 has a shape of a frame. Specifically, the mold frame 600 may be disposed to correspond to an edge region on the upper surface of the optical member 400. In this case, the mold frame 600 does not overlap the display region DA. On the mold frame 600, the display member 200 is disposed. The mold frame 600 serves to fix the display member 200 and the backlight unit BLU.

The receiving member 700 is disposed at the lowermost end of the display apparatus 1000, and receives the backlight unit BLU. The receiving member 700 includes a bottom portion 710 and a plurality of side wall portions 720 connected to the bottom portion 710. In an exemplary embodiment, on any one inner side surface of the side wall portions 720 of the receiving member 700, the light source LS may be disposed. The receiving member 700 may include a metal having rigidity.

Figure 3:
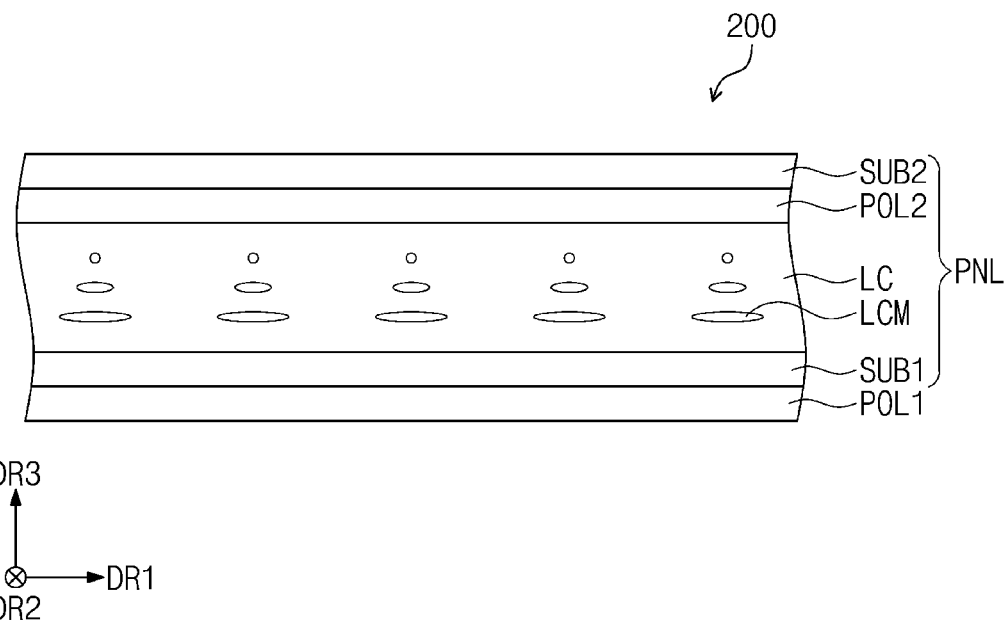
FIG. 3 is an enlarged cross-sectional view of a display member according to an exemplary embodiment.

FIG. 3 is an enlarged cross-sectional view of a display member according to an exemplary embodiment.

Referring to FIG. 3, the display member 200 includes a first polarizing layer POL1 and a display panel PNL. The first polarizing layer POL1 is disposed between the display panel PNL and the backlight unit BLU, and polarizes components of light provided from the backlight unit BLU. The first polarizing layer POL1 may have a transmission axis (not shown) having a predetermined direction.

The display panel PNL is disposed on an upper portion of the first polarizing layer POL1, and displays an image through the display region DA (see FIG. 1 and FIG. 2). As described above, the display panel PNL may be a light-receiving type display panel. As an example, according to an exemplary embodiment, the display panel PNL may be a liquid crystal display panel.

The display panel PNL includes a first substrate SUB1, a second polarizing layer POL2, a second substrate SUB2, and a liquid crystal layer LC.

The first substrate SUB1 is disposed on an upper portion of the first polarizing layer POL1. The first substrate SUB1 may be composed of a material having high light transmittance so as to easily transmit light provided from the backlight unit BLU. As an example, the first substrate SUB1 may be a transparent glass substrate, a transparent plastic substrate, or a transparent film.

Although not shown, on the plane, at least one pixel region (not shown) and at least one non-pixel region (not shown) adjacent to the pixel region are defined on the first substrate SUB1. In an exemplary embodiment, the pixel region is provided in plurality and the non-pixel region may be defined between the pixel regions.

On the pixel regions of the first substrate SUB1, pixels (not shown) may be respectively disposed. The pixels may include a plurality of pixel electrodes (not shown) and a plurality of thin film transistors (not shown) electrically connected to the pixel electrodes in one-to-one correspondence. The thin film transistors may be respectively connected to the pixel electrodes, and switch a driving signal provided to each pixel electrode.

The second substrate SUB2 is disposed on an upper portion of the first substrate SUB1 and faces the first substrate SUB1. Between the second substrate SUB2 and the first substrate SUB1, the liquid crystal layer LC may be disposed. The liquid crystal layer LC includes a plurality of liquid crystal molecules LCM arranged in a predetermined direction.

The second substrate SUB2 may include a common electrode (not shown), which forms an electric field to control the arrangement of the liquid crystal molecules LCM together with the pixel electrodes. The display member 200 drives the liquid crystal layer LC and displays an image in the third direction DR3, which is the upper direction.

Although not shown, the display member 200 may be provided with a driving chip that provides the driving signal, a tape carrier package on which the driving chip is mounted, and a printed circuit substrate that is electrically connected to the display panel PNL through the tape carrier package.

The second polarizing layer POL2 is disposed between the liquid crystal layer LC and the second substrate SUB2. However, the inventive concepts are not limited to the position of the second polarizing layer POL2 illustrated in FIG. 3. As an example, according to another exemplary embodiment, the second polarizing layer POL2 may be disposed on an upper portion of the second substrate SUB2.

In an exemplary embodiment, the second polarizing layer POL2 may be a wire grid polarizer. Although not shown in the drawings, the second polarizing layer POL2 may include a plurality of nanowires made of a metal material. However, the inventive concepts are not limited to the specific shape and material of the second polarizing layer POL2.

The second polarizing layer POL2 may have an absorption axis (not shown) having a predetermined direction. When the display mode of the display apparatus 1000 is in the light state, the second polarizing layer POL2 transmits light, and when the display mode of the display apparatus 1000 is in the dark state, the second polarizing layer POL2 absorbs light.

According to an exemplary embodiment, according to the arrangement mode of the liquid crystal molecules (not shown), the transmission axis of the first polarizing layer POL1 and the absorption axis of the second polarizing layer POL2 may be set. As an example, the transmission axis of the first polarizing layer POL1 may be perpendicular to the absorption axis of the second polarizing layer POL2 on the plane.

Figure 5:
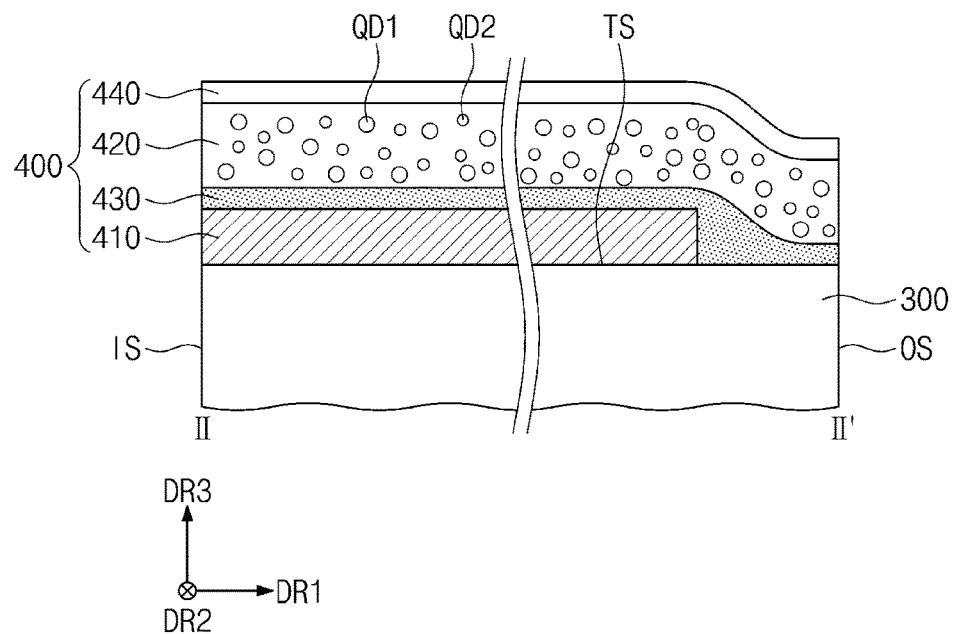
FIG. 5 is a cross-sectional view taken along sectional line II-II' shown in FIG. 4 according to an exemplary embodiment.
Figure 6:
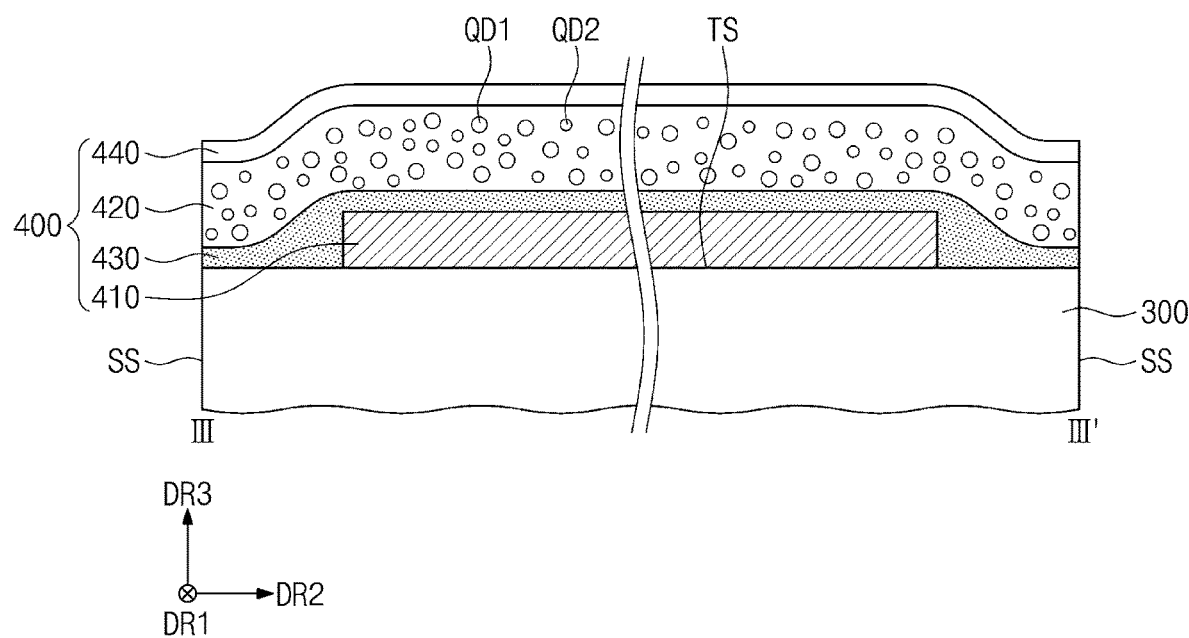
FIG. 6 is a cross-sectional view taken along sectional line III-III' shown in FIG. 4 according to an exemplary embodiment.

FIG. 4 is a perspective view of a light guide member and an optical member according to an exemplary embodiment. FIG. 5 is a cross-sectional view taken along sectional line II-II' shown in FIG. 4 according to an exemplary embodiment. FIG. 6 is a cross-sectional view taken along sectional line III-III' shown in FIG. 4 according to an exemplary embodiment.

Referring to FIG. 4 to FIG. 6, the optical member 400 includes a low refraction layer 410, a light conversion layer 420, a first cover layer 430, and a second cover layer 440.

The low refraction layer 410 is disposed on the light outgoing surface TS of the light guide member 300. The low refraction layer 410 has a refractive index lower than that of the light guide member 300. As an example, the refractive index of the low refraction layer 410 may be about 1.1 to about 1.3 inclusive. The low refraction layer 410 forms a refractive index difference at an interface between the low refraction layer 410 and the light guide member 300 such that light provided from the light source LS to the light guide member 300 is totally reflected in the light guide member 300.

Although not shown in the drawings, the low refraction layer 410 may include a plurality of pores. According to the density of the pores, the refractive index of the low refraction layer 410 may be controlled. As an example, as the number of the pores included in the low refraction layer 410 increases, the refractive index of the low refraction layer 410 may decrease.

According to an exemplary embodiment, a typical air gap formed between the light conversion layer 420 and the light guide member 300 may be replaced by the low refraction layer 410. Therefore, even when the light guide member 300 and the light conversion layer 420 are coupled to each other by the low refraction layer 410, the light provided to the light guide member 300 may be totally reflected and guided.

According to an exemplary embodiment, the thickness of the low refraction layer 410 may be about 0.5 μm or greater. When the thickness of the low refraction layer 410 is less than about 0.5 of the light provided to the light guide member 300, light satisfying the total reflection condition is not totally reflected in the light guide member 300, and may be incident on the light conversion layer 420 through the low refraction layer 410.

The low refraction layer 410 is disposed so as to overlap a portion of a region on the light outgoing surface TS of the light guide member 300. The area of the upper surface of the low refraction layer 410 may be smaller than the area of the light outgoing surface TS of the light guide member 300. Therefore, of the region on the light outgoing surface TS of the light guide member 300, a portion of the region on which the low refraction layer 410 is not disposed may be exposed by the low refraction layer 410 on a plane. The exposed region may overlap an edge region on the light outgoing surface TS of the light guide member 300.

The light conversion layer 420 is disposed on an upper portion of the low refraction layer 410. The light conversion layer 420 has a refractive index higher than that of the light guide member 300. As an example, the refractive index of the light conversion layer 420 may be about 1.65 or greater.

The light conversion layer 420 serves to convert the wavelength band of incident light. The light conversion layer 420 according to an exemplary embodiment may include a plurality of light conversion particles QD1 and QD2. Each of the light conversion particles QD1 and QD2 absorbs at least a portion of incident light, and emits or transmits light having a specific color.

When the light incident on the light conversion layer 420 has sufficient energy to excite a light conversion particle, the conversion particle absorbs at least a portion of the incident light and becomes excited, and then emits light having a specific color while being stabilized. Alternatively, when the incident light has energy that is difficult to excite the conversion particle, the incident light may pass through the light conversion layer 420, and become visible from the outside.

Specifically, according to the particle size of the conversion particle, the color of light emitted by the conversion particle may be determined. In general, the larger the particle size, the longer wavelength light is generated. The smaller the particle size, the shorter wavelength light is generated.

As an example, each of the light conversion particles QD1 and QD2 may be a quantum dot. Light emitted from the light conversion particles QD1 and QD2 of the light conversion layer 420 may be emitted in various directions.

Specifically, the light conversion particles include first quantum dots QD1 and second quantum dots QD2. Each of the first quantum dots QD1 absorbs the first light and may convert the same into a second light having a second wavelength band. The center wavelength of the second wavelength band is greater than the center wavelength of the first wavelength band. As an example, the second wavelength band may be about 640 nm to about 780 nm inclusive. That is, each of the first quantum dots QD1 may substantially convert blue light into red light.

Each of the second quantum dots QD2 absorbs the first light and may convert the same into a third light having a third wavelength band. The center wavelength of the third wavelength band is greater than the center wavelength of the first wavelength band, and smaller than the center wavelength of the second wavelength band. As an example, the third wavelength band may be about 480 nm to about 560 nm inclusive. That is, each of the second quantum dots QD2 may substantially convert blue light into green light.

As described above, according to the particle size of the light conversion particles QD1 and QD2, the wavelength of light generated by the corresponding light conversion particles QD1 and QD2 may be determined. According to an exemplary embodiment, the size of each of the first quantum dots QD1 may be greater than the size of each of the second quantum dots QD2.

Although not shown in the drawings, the light conversion layer 420 may further include scatterers (not shown). The scatterers (not shown) may be in the form of being mixed with the first quantum dots QD1 and the second quantum dots QD2.

The first cover layer 430 is disposed between the low refraction layer 410 and the light conversion layer 420. The first cover layer 430 is disposed on an upper portion of the low refraction layer 410, and comes in direct contact with the low refraction layer 410. Specifically, the first cover layer 430 covers the upper surface and side surfaces of the low refraction layer 410. The first cover layer 430 according to an exemplary embodiment may include an inorganic material. As an example, the first cover layer 430 may include silicon oxide ($SiO_x$) or silicon nitride ($SiN_x$).

According to an exemplary embodiment, the first cover layer 430 may cover a portion of the side surfaces of the side surfaces of the low refraction layer 410. Specifically, one side surface of the side surfaces of the low refraction layer 410, the surface adjacent to the light source LS, is not covered by the first cover layer 430. The side surfaces of the low refraction layer 410, except for the one side surface, are covered by the first cover layer 430.

A portion of the region on the light outgoing surface TS of the light guide member 300 not overlapping the low refraction layer 410 is covered by the first cover layer 430. The portion of the region comes in direct contact with the first cover layer 430.

Unlike in an exemplary embodiment, when the side surfaces of the low refraction layer 410 are not covered by the first cover layer 430, but are exposed to the outside, air, moisture, or the like may pass through the side surfaces of the low refraction layer 410. The air, moisture, or the like passed through the low refraction layer 410 may penetrate the first cover layer 430 disposed on an upper portion thereof and then pass through the light conversion layer 420, and accordingly, the light conversion particles QD1 and QD2 of the light conversion layer 420 may be deteriorated. That is, the display quality of the display apparatus 1000 may be lowered. However, according to an exemplary embodiment, since at least a portion of the side surfaces of the low refraction layer 410 is covered by the first cover layer 430, a phenomenon of air or moisture passing through the side surfaces of the low refraction layer 410 may be mitigated. That is, according to an exemplary embodiment, a phenomenon of the light conversion layer 420 being deteriorated by the air or moisture passing through the low refraction layer 410 may be mitigated.

In addition, according to an exemplary embodiment, since the edge portion on the light outgoing surface TS of the light guide member 300, the portion not overlapping the low refraction layer 410, is in direct contact with the first cover layer 430, a phenomenon of the low refraction layer 410 being peeled off, the durability of which has been weakened by the pores (not shown), may be mitigated.

On the light conversion layer 420, the second cover layer 440 is disposed. The second cover layer 440 comes in direct contact with the upper surface of the light conversion layer 420. The second cover layer 440 may include an inorganic material. As an example, the second cover layer 440 may include silicon oxide ($SiO_x$) or silicon nitride ($SiN_x$). The second cover layer 440 protects the light conversion layer 420 from the outside, and may prevent a phenomenon of the light conversion particles QD1 and QD2 of the light conversion layer 410 being deteriorated from occurring.

In an exemplary embodiment, the second cover layer 440 includes the same material as the first cover layer 430. However, the inventive concepts are not limited thereto. According to another exemplary embodiment, the first cover layer 430 and the second cover layer 440 may include inorganic materials different from each other.

Figure 7:
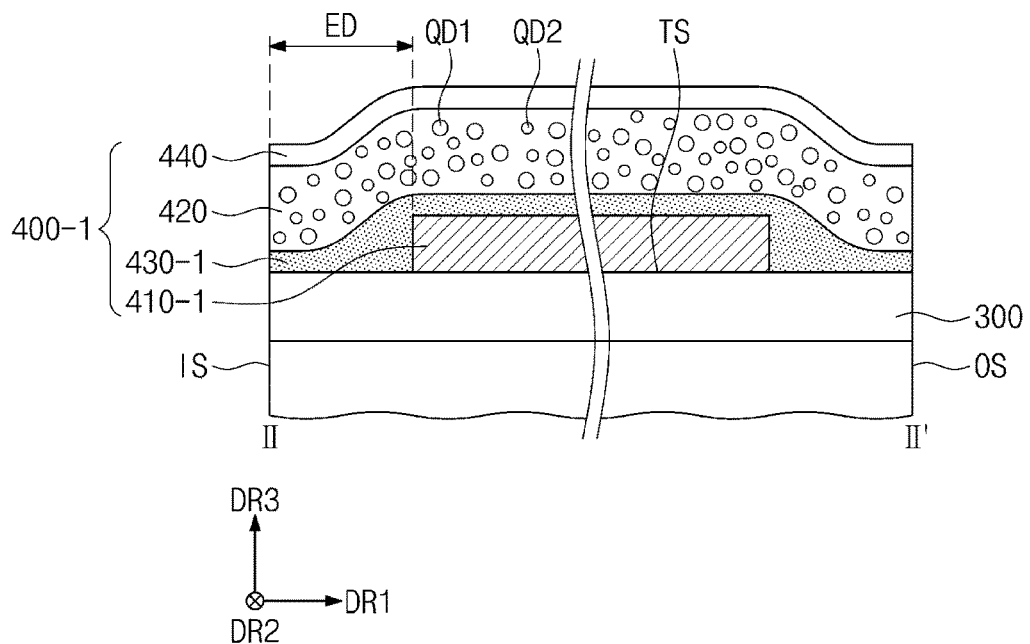
FIG. 7 is a cross-sectional view of an optical member according to an exemplary embodiment.

FIG. 7 is a cross-sectional view of an optical member according to an exemplary embodiment.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

FIG. 7 is a cross-sectional view corresponding to sectional line II-II' shown in FIG. 4, and a cross-sectional view corresponding to sectional line III-III' is the same as the cross-sectional view shown in FIG. 6, and, thus, the illustration thereof is omitted.

Referring to FIG. 7, a low refraction layer 410-1 according to an exemplary embodiment may be disposed on the center region of the region on the light outgoing surface TS. Therefore, a region on the light outgoing surface TS, the region not overlapping the low refraction layer 410-1, may have a shape of a frame.

A first cover layer 430-1 is disposed on the low refraction layer 410-1. The first cover layer 430-1 covers the upper surface and all the side surfaces of the low refraction layer 410-1. In addition, the first cover layer 430-1 may come in direct contact with the edge region on the light outgoing surface TS of the light guide member 300, the region not overlapping the low refraction layer 410-1.

In an exemplary embodiment, the light provided from the light source LS to the light guide member 300 is not provided on a region ED adjacent to the light source LS of the edge region. Specifically, the width of the region ED adjacent to the light source LS of the edge region is defined as a distance between the light incident surface IS and the low refraction layer 410-1 on a plane. The width may be set within a range in which the light generated from the light source LS is not provided. Unlike exemplary embodiments, when light is provided on the region ED adjacent to the light source LS of the edge region of the light guide member 300, since the refractive index difference between the first cover layer 430-1 and the light guide member 300 is relatively small, of the light provided from the light source LS to the inside of the light guide member 300, light satisfying the total reflection condition may not be reflected from the light outgoing surface TS, but penetrated, and be incident on the first cover layer 430-1. In this case, light leakage may occur in a light incident region.

According to an exemplary embodiment, since all the side surfaces of the low refraction layer 410-1 are covered by the first cover layer 430-1, the deterioration of the light conversion layer 420 may be more effectively prevented.

Figure 8:
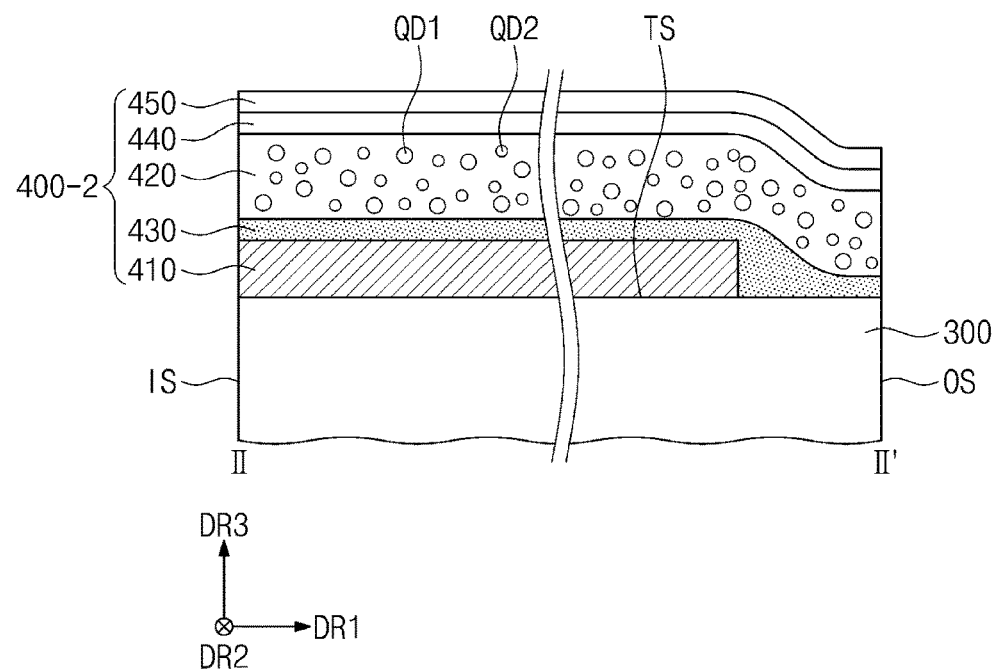
FIG. 8 is a cross-sectional view of an optical member according to an exemplary embodiment.

FIG. 8 is a cross-sectional view of an optical member according to an exemplary embodiment. FIG. 8 corresponds to a cross-sectional view taken along sectional line II-II' shown in FIG. 4.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

Referring to FIG. 8, an optical member 400-2 according to an exemplary embodiment may further include a third cover layer 450. The third cover layer 450 is disposed on an upper portion of the second cover layer 440, and covers the upper surface of the second cover layer 440. The third cover layer 450 may include an organic material. The third cover layer 450 serves to cover empty spaces which may be formed in the second cover layer 440. Therefore, according to an exemplary embodiment, the light conversion layer 420 may be more effectively protected.

Figure 9:
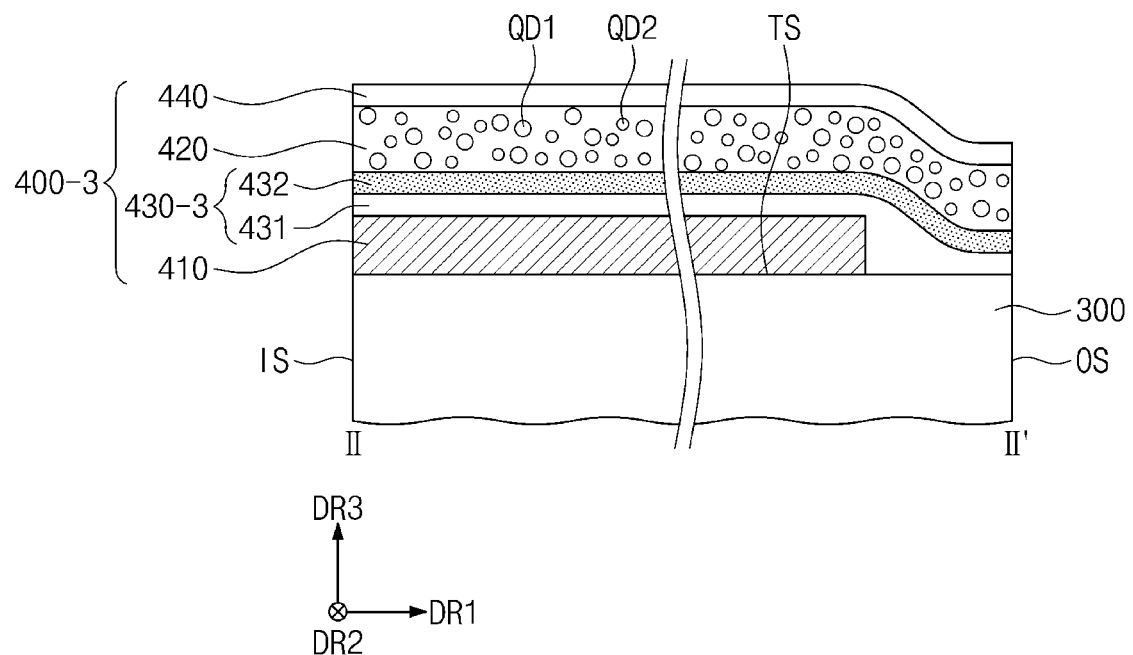
FIG. 9 is a cross-sectional view of an optical member according to an exemplary embodiment.

FIG. 9 is a cross-sectional view of an optical member according to an exemplary embodiment. FIG. 9 corresponds to a cross-sectional view taken along sectional line II-II' shown in FIG. 4.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

Referring to FIG. 9, a first cover layer 430-3 of an optical member 400-3 according to an exemplary embodiment includes an adhesive layer 431 and a barrier layer 432.

The adhesive layer 431 is disposed on the low refraction layer 410. The adhesive layer 431 covers the upper surface and at least a portion of the side surfaces of the low refraction layer 410. In addition, the adhesive layer 431 covers a portion of the edge region of the light outgoing surface TS of the light guide member 300. The adhesive layer 431 may include a material having adhesion. As an example, the adhesive layer 431 may include an organic material. The adhesive layer 431 may come in direct contact with the portion of the region of the light guide member 300.

The barrier layer 432 is disposed on an upper portion of the adhesive layer 431. The barrier layer 432 may include an inorganic material. As an example, the barrier layer 432 may include silicon oxide ($SiO_x$) or silicon nitride ($SiN_x$).

According to an exemplary embodiment, since the adhesive layer 431 is disposed between the barrier layer 432 and the light guide member 300, and increases adhesion between the barrier layer 432 and the light guide member 300, the durability of a display apparatus may be further improved.

Figure 10:
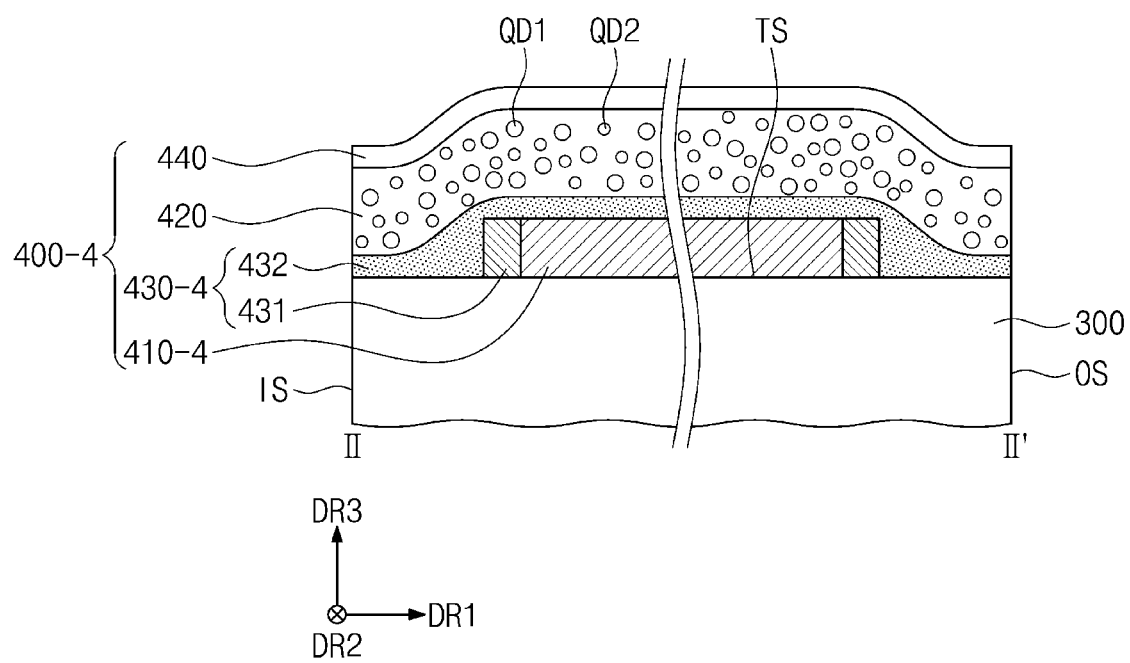
FIGS. 10 and 11 are cross-sectional views of an optical member according to various exemplary embodiments.
Figure 11:
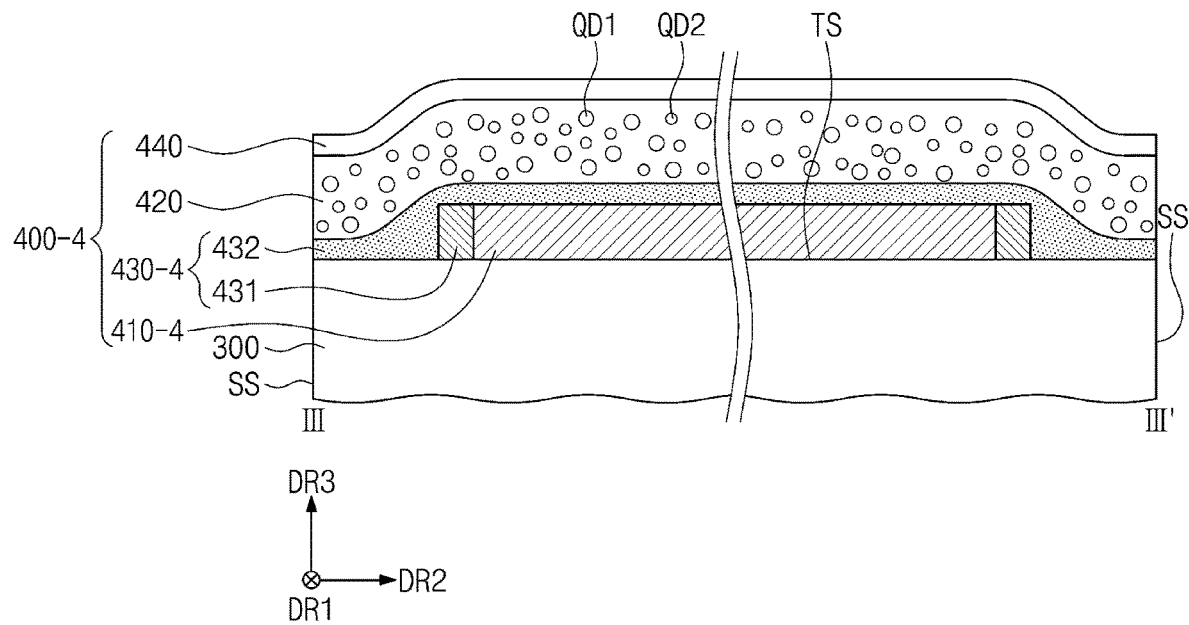

FIG. 10 and FIG. 11 are cross-sectional views of an optical member according to various exemplary embodiments. FIG. 10 corresponds to a cross-sectional view taken along sectional line II-II' shown in FIG. 4, and FIG. 11 corresponds to a cross-sectional view taken along sectional line III-III' shown in FIG. 4.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

Referring to FIG. 10 and FIG. 11, an optical member 400-4 according to an exemplary embodiment includes the adhesive layer 431 and the barrier layer 432.

The adhesive layer 431 is disposed to surround side surfaces of a low refraction layer 410-4 on the light outgoing surface TS of the light guide member 300. In an exemplary embodiment, the adhesive layer 431 does not cover the upper surface of the low refraction layer 410-4.

The barrier layer 432 is disposed on the low refraction layer 410-4 and the adhesive layer 431. The barrier layer 432 covers the upper surface of the low refraction layer 410-4, the upper surface of the adhesive layer 431, and the outer circumferential surface of the adhesive layer 431.

According to an exemplary embodiment, since the adhesive layer 431 increases adhesion between the light guide member 300 and the barrier layer 432, the durability of a display apparatus may be further improved.

Figure 12:
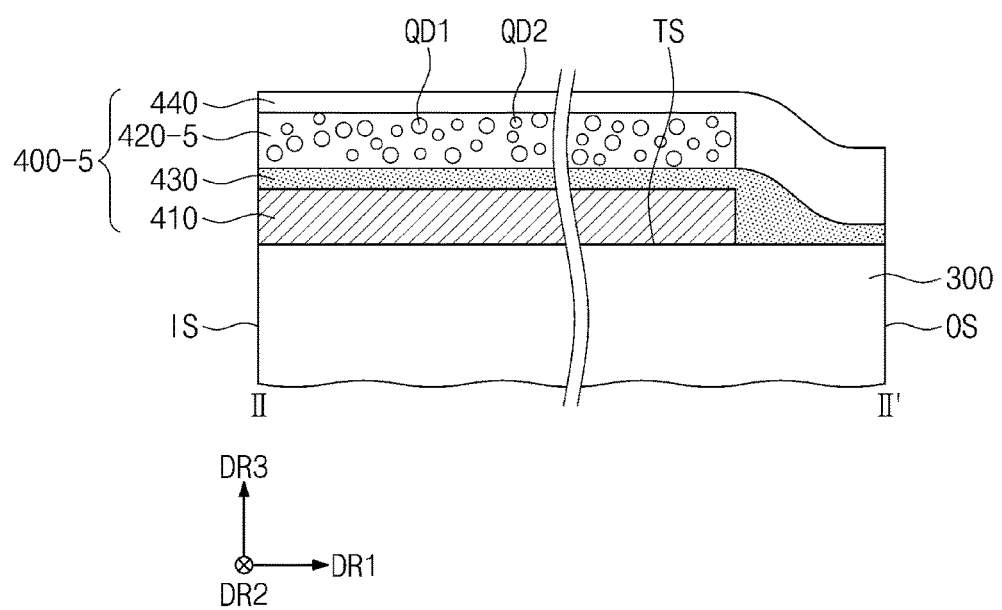
FIG. 12 is a cross-sectional view of an optical member according to an exemplary embodiment.

FIG. 12 is a cross-sectional view of an optical member according to an exemplary embodiment. FIG. 12 corresponds to a cross-sectional view taken along sectional line II-II' shown in FIG. 4.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

Referring to FIG. 12, a light conversion layer 420-5 of an optical member 400-5 according to another embodiment is disposed so as to overlap a portion of the region on the light outgoing surface TS of the light guide member 300. The light conversion layer 420-5 may overlap the low refraction layer 410 on a plane. On a plane, the area of the light conversion layer 420-5 may be smaller than the entire area of the light outgoing surface TS of the light guide member 300.

The second cover layer 440 is disposed on an upper portion of the light conversion layer 420-5. The second cover layer 440 coves the upper surface and side surfaces of the light conversion layer 420-5. According to an exemplary embodiment, the second cover layer 440 may cover a portion of the side surfaces of the light conversion layer 420-5. Specifically, one side surface of the light conversion layer 420-5, the surface adjacent to the light source LS, may not be covered by the second cover layer 440. The side surfaces of the light conversion layer 420-5, except for the one side surface, are covered by second cover layer 440.

According to an exemplary embodiment, since the second cover layer 440 covers not only the upper surface of the light conversion layer 420-5, but the side surfaces thereof, the light conversion layer 420-5 may be more effectively protected.

Figure 13:
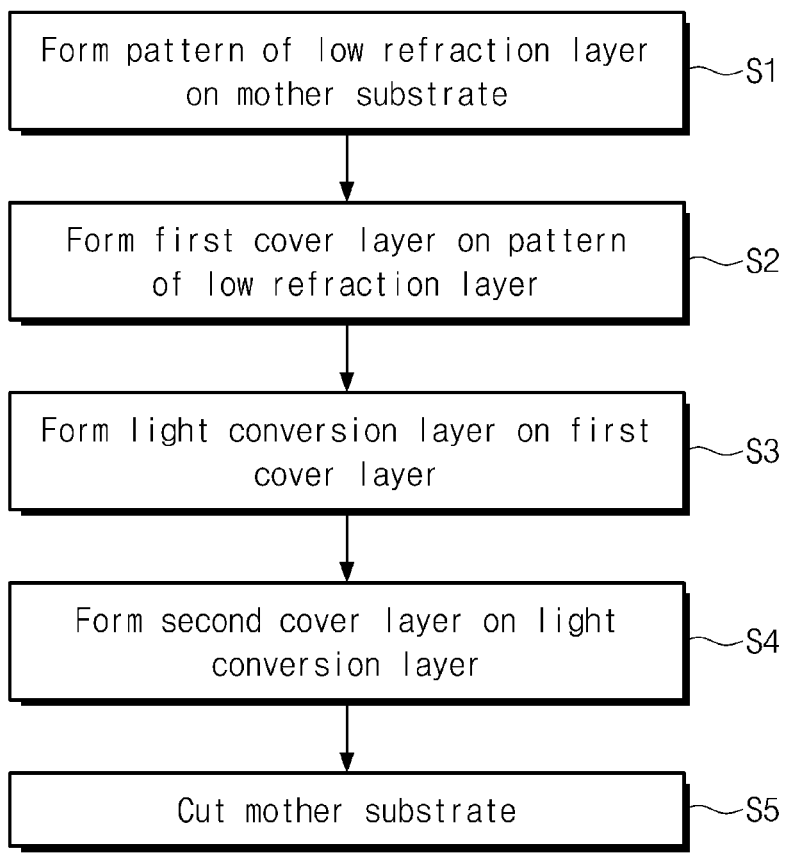
FIG. 13 is a flow chart of a manufacturing method of an optical member according to an exemplary embodiment.

FIG. 13 is a flow chart of a manufacturing method of an optical member according to an exemplary embodiment. FIG. 14A to FIG. 21B are views illustrating a manufacturing method of the optical member shown in FIG. 13 according to various exemplary embodiments.

FIG. 14A, FIG. 15A, FIG. 16A, FIG. 18A, FIG. 19A, FIG. 20A, and FIG. 21A are plan views of a mother substrate 300' of the light guide member 300, and FIG. 14B, FIG. 15B, FIG. 16B, FIG. 19B, and FIG. 20B are cross-sectional views taken along sectional line IV-IV' shown in FIG. 14A, FIG. 15A, FIG. 16A, FIG. 18A, FIG. 19A, and FIG. 20A.

Hereinafter, referring to FIG. 13 together with FIG. 14A to FIG. 20B, a manufacturing method of the optical member 400 according to an exemplary embodiment will be described.

Figure 14A:
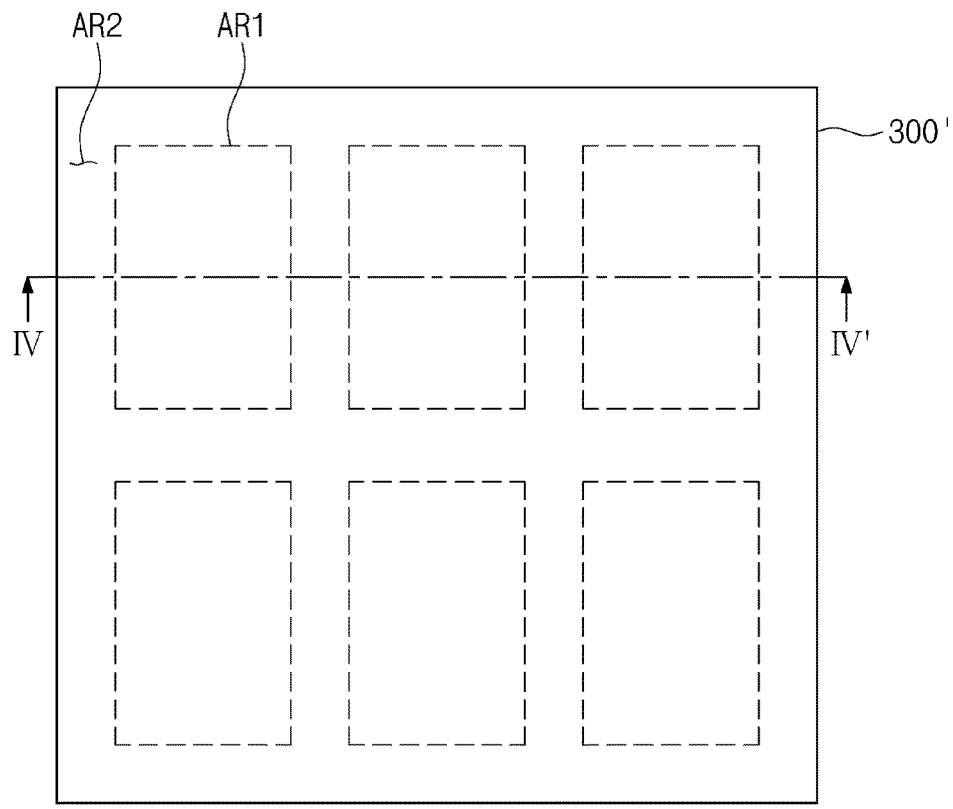
FIGS. 14A, 14B, 15A, 15B, 16A, 16B, 17A, 17B, 17C, 18A, 18B, 19A, 19B, 20A, 20B, 21A, and FIG. 21B are views illustrating a manufacturing method of the optical member shown in FIG. 13 according to an exemplary embodiment.
Figure 14A:
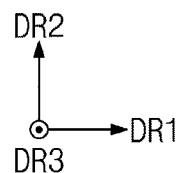
Figure 14B:
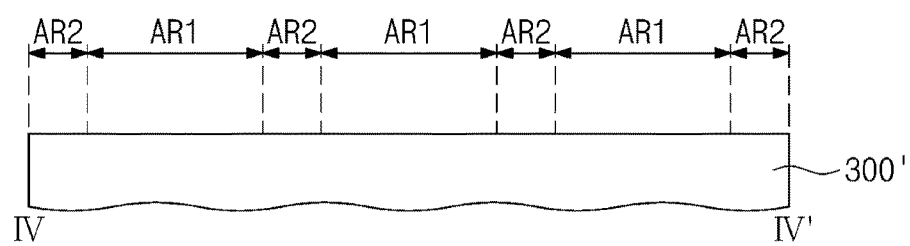
Figure 14B:
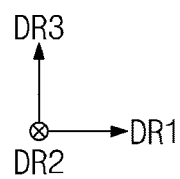

As illustrated in FIG. 14A and FIG. 14B, the mother substrate 300' is first prepared. On the mother substrate 300', a plurality of first regions AR1 and a second region AR2 may be defined. The first regions AR1 are arranged to be spaced apart from each other on the mother substrate 300'. The first regions AR1 may be arranged in a matrix form. Specifically, the first regions AR1 may be arranged in the first direction DR1 and the second direction DR2.

The second region AR2 is defined as a region on the mother substrate 300', except for the first regions AR1. The second region AR2 surrounds the first regions AR1.

For convenience of explanation, in FIG. 14A to FIG. 20A, the first regions AR1 arranged in three columns and two rows on the mother substrate 300' are illustrated. However, the inventive concepts are not particularly limited to the size of the mother substrate 300', and the arrangement relationship and shape of the first regions AR1.

Figure 15A:
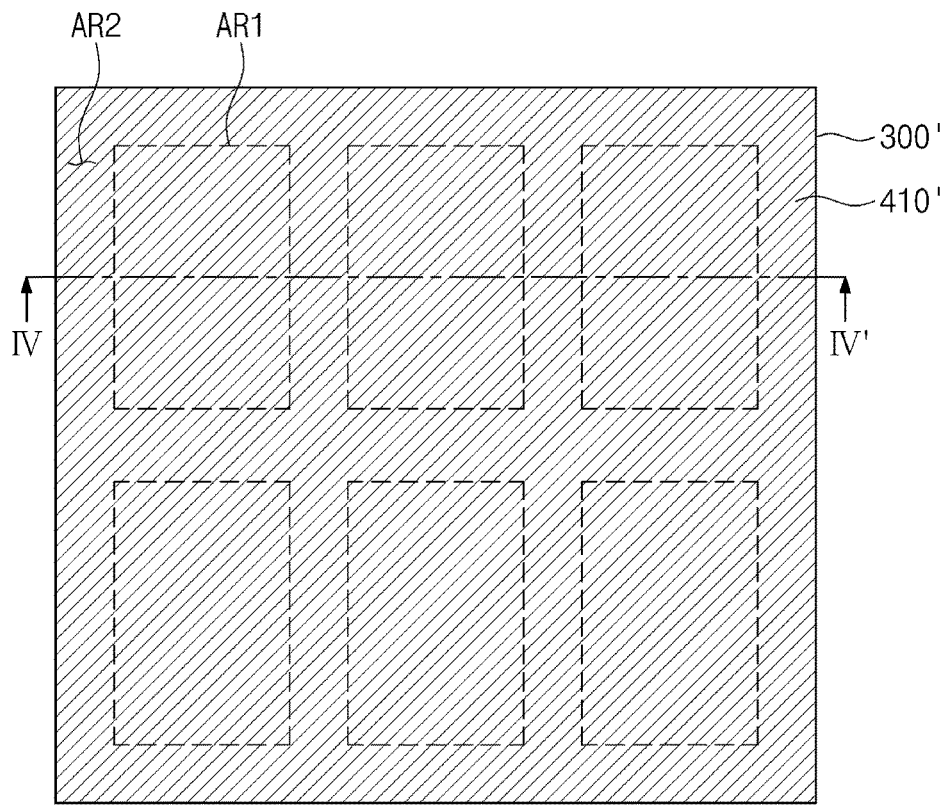
Figure 15B:
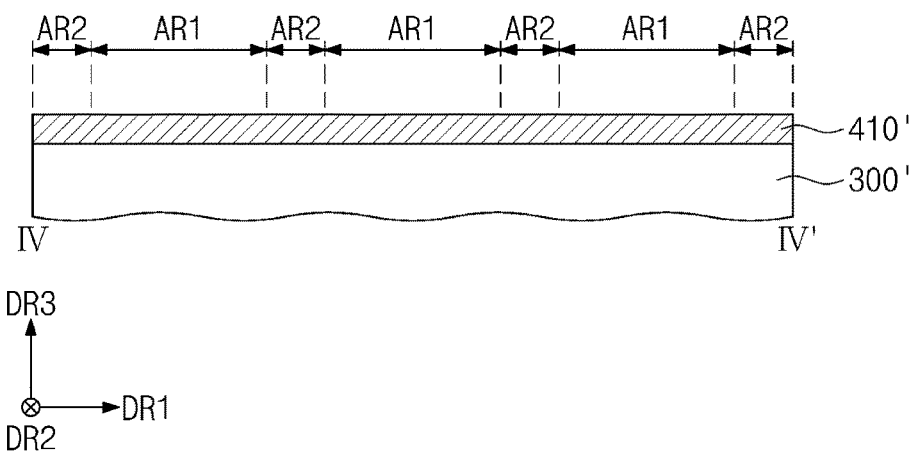

Thereafter, as illustrated in FIG. 15A and FIG. 15B, a preliminary solution 410' is applied on the mother substrate 300'. The preliminary solution 410' may be applied on the entire upper surface of the mother substrate 300'. The preliminary solution 410' may be a material of the low refraction layer 410 to be described later. As an example, the preliminary solution 410' may include hollow silica or a silica polymer.

Figure 16A:
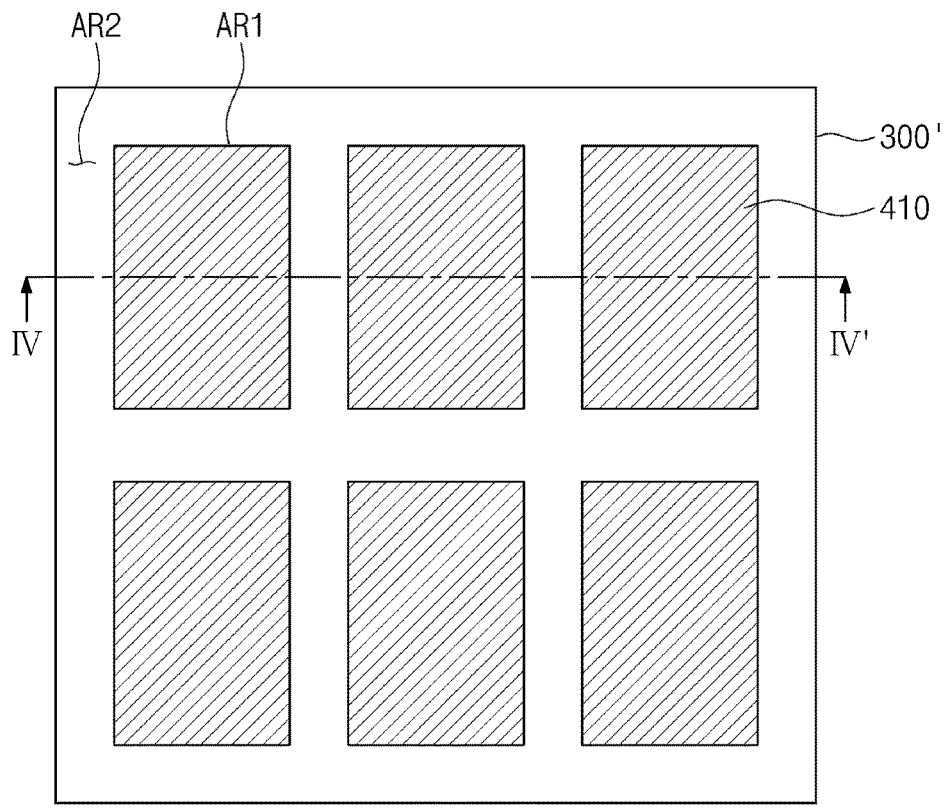
Figure 16B:
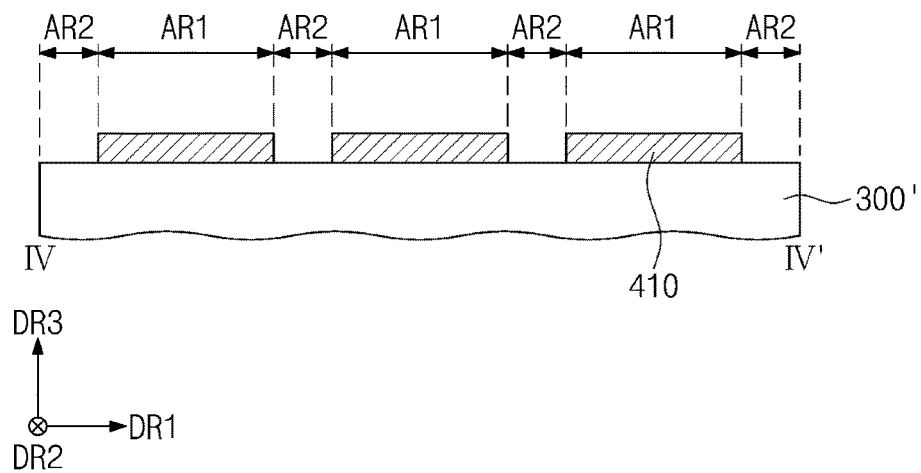

Thereafter, as illustrated in FIG. 16A and FIG. 16B, the preliminary solution 410' disposed on the second region AR2 is removed. The preliminary solution 410' not removed is disposed on the first regions AR1.

According to an exemplary embodiment, the preliminary solution 410' of the second region AR2 may be removed by any one of a photolithography process, an edge bead removal (EBR) process and a laser process.

Figure 17A:
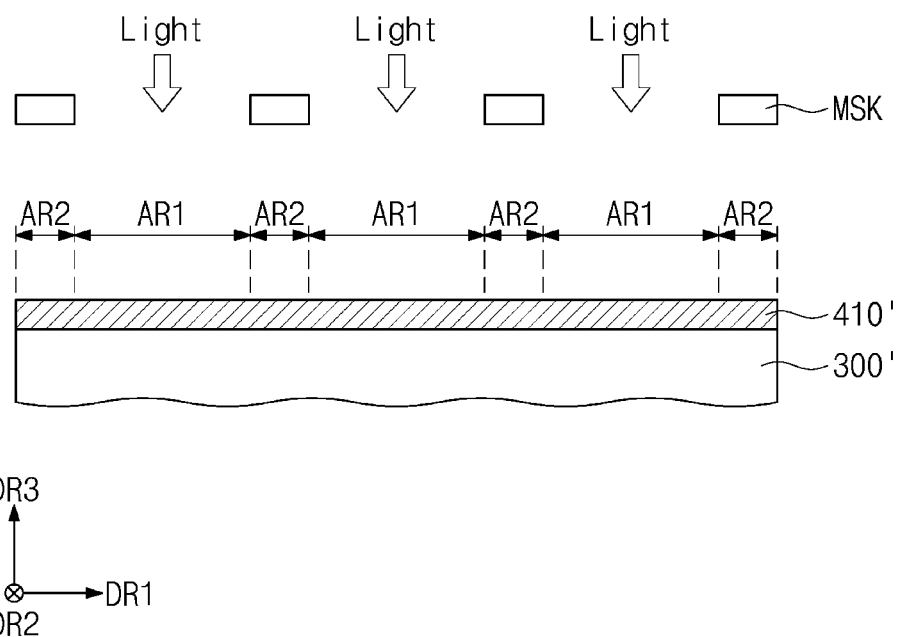

First, as illustrated in FIG. 17A, according to an exemplary embodiment, the preliminary solution 410' of the second region AR2 may be removed by a photolithography process.

Specifically, the preliminary solution 410' may include a photoresist. As an example, the preliminary solution 410' may include positive photoresist.

The patterning process of the preliminary solution 410' according to a photolithography process is as follows. A mask MSK having a mask pattern is disposed on the preliminary solution 410', and light is irradiated on the mask MSK. By the pattern of the mask MSK, light is transmitted in each of the first regions AR1, and light is blocked in the second region AR2. Therefore, by the pattern of the mask MSK, light is irradiated on the preliminary solution 410' corresponding the first regions AR1. After the irradiation of light, the preliminary solution 410' of the second region AR2 may be removed through developing and etching processes.

Figure 17B:
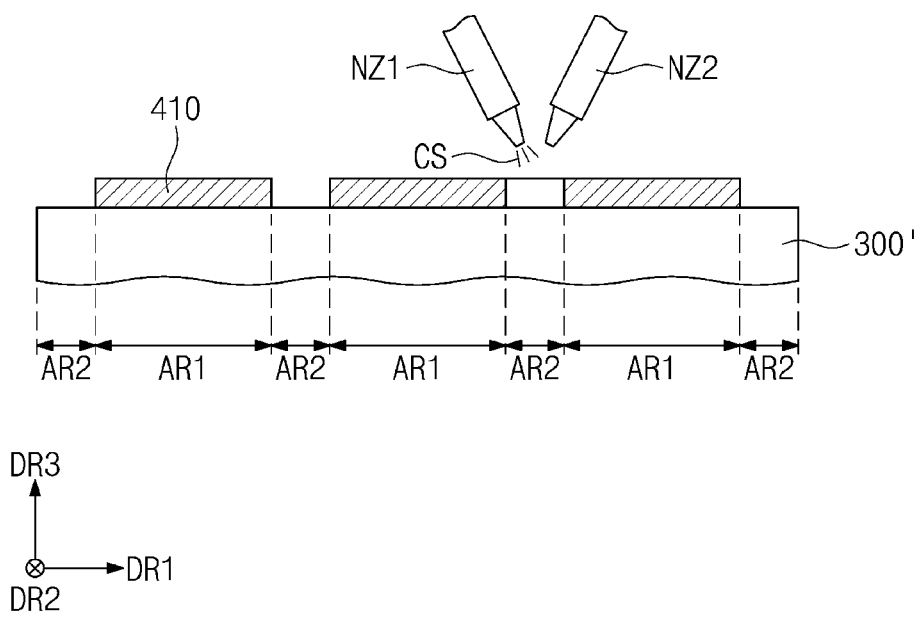

In addition, as illustrated in FIG. 17B, according to an exemplary embodiment, the preliminary solution 410' of the second region AR2 may be removed by an edge bead removal (EBR) process.

Specifically, using a first nozzle NZ1, gas CS is sprayed on the second region AR2. The preliminary solution 410' on the second region AR2 may be dispersed around the second region AR2 due to pressure of the gas CS sprayed from the first nozzle NZ1. Therefore, the preliminary solution 410' is not disposed on the second region AR2.

In an exemplary embodiment, the process of removing the preliminary solution 410' may further include a process of sucking the preliminary solution 410' using a second nozzle NZ2. The second nozzle NZ2 is disposed adjacent to the first nozzle NZ1 and may be simultaneously operated with the first nozzle NZ1. The second nozzle NZ2 sucks material present around the second region AR2.

When only the first nozzle NZ1 is operated, since the preliminary solution 410' disposed on the second region AR2 is moved to the adjacent first regions AR1 by the first nozzle NZ1, the thickness of the preliminary solution 410' of each of the first regions AR1 may become uneven. However, when the second nozzle NZ2 is operated together with the first nozzle NZ1, since the preliminary solution 410' dispersed by the first nozzle NZ1 around the second region AR2 is sucked by the second nozzle NZ2, a phenomenon of the thickness and shape of the preliminary solution 410' corresponding to each of the first regions AR1 becoming uneven may be prevented.

Figure 17C:
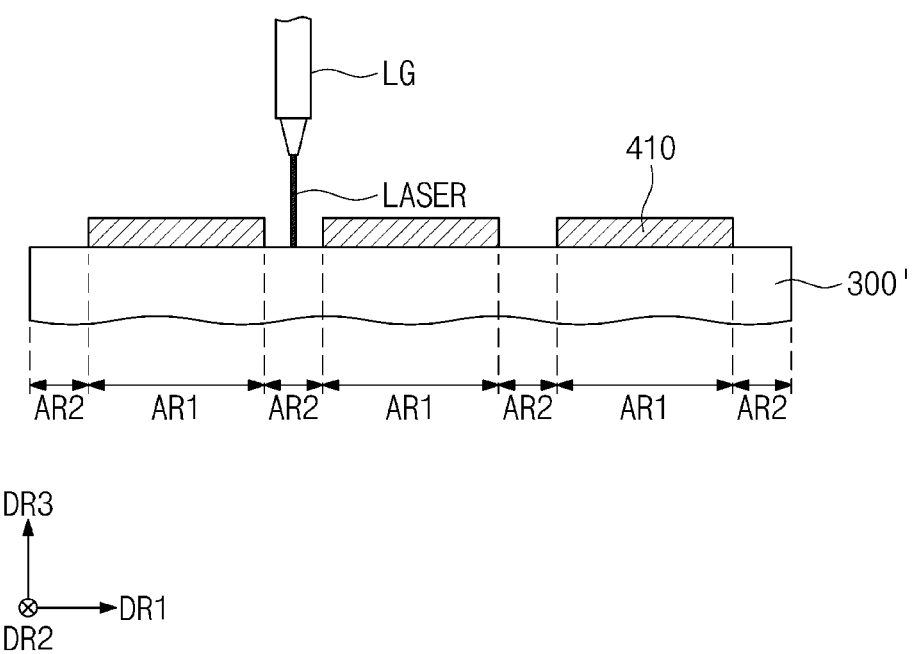

As illustrated in FIG. 17C, according to an exemplary embodiment, the preliminary solution 410' of the second region AR2 may be removed by a laser process.

Specifically, using a laser generator LG, laser is irradiated on the second region AR2. By the laser, the preliminary solution 410' disposed on the second region AR2 may be removed.

After the preliminary solution 410' on the second region AR2 is removed, a pattern of the low refraction layer 410 is formed on the first regions AR1 through a post-treatment process S1. As an example, the post-treatment process S1 may be a process in which heat treatment is performed or another solution is added. Through the post-treatment process S1, a plurality of pores (not shown) may be formed on the pattern of the low refraction layer 410. By controlling the density of the pores (not shown) included in the pattern of the low refraction layer 410, the refractive index of the pattern of the low refraction layer 410 may be set.

In an exemplary embodiment, the post-treatment process S1 is performed after the preliminary solution 410' is patterned. However, the inventive concepts are not limited thereto. According to another exemplary embodiment, a post-treatment process S1 may be first performed on the preliminary solution 410' applied on the entire region of the mother substrate 300', and then by performing patterning through an etching process, a scribing process, or the like, the pattern of the low refraction layer 410 may be formed.

Figure 18A:
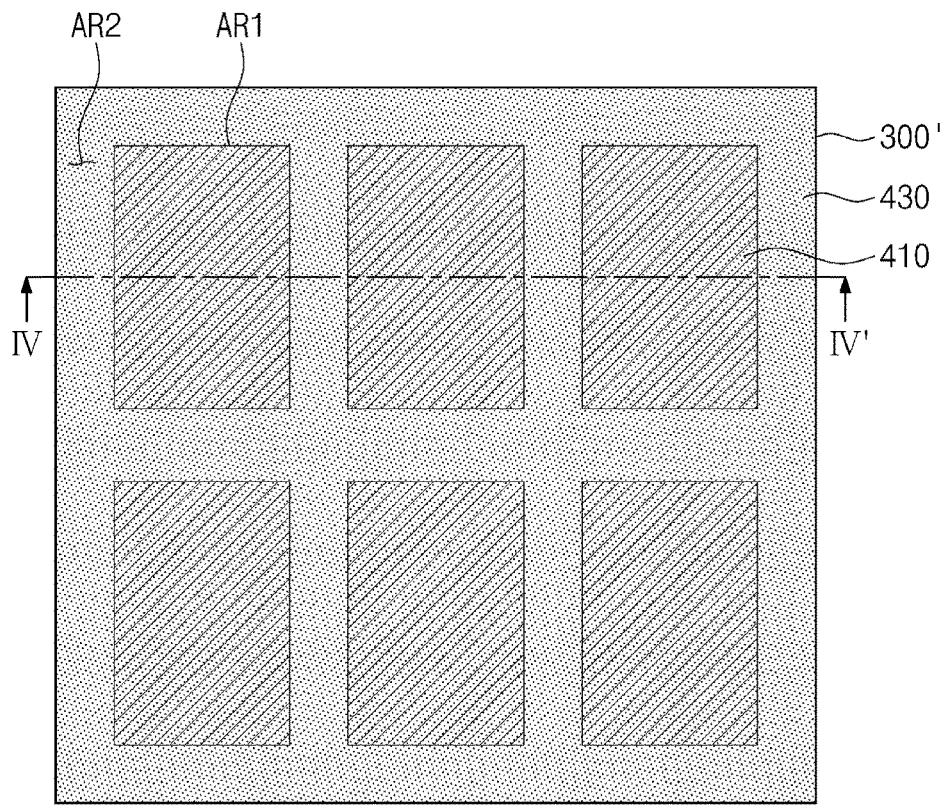
Figure 18B:
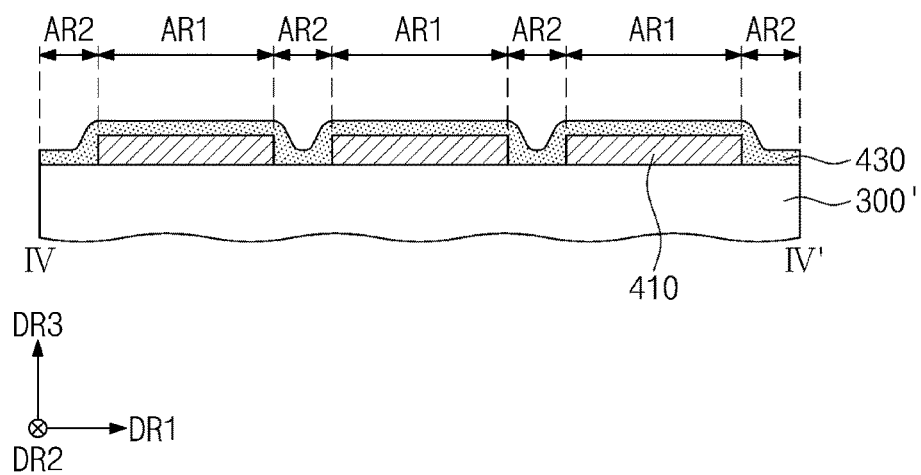

As illustrated in FIG. 18A and FIG. 18B, on the pattern of the low refraction layer 410, the first cover layer 430 is formed by a process S2. The first cover layer 430 overlaps the entire region of the mother substrate 300'. The first cover layer 430 covers the upper surface and all the side surfaces of the pattern of the low refraction layer 410. The first cover layer 430 includes an inorganic material. As an example, the first cover layer 430 may include silicon oxide ($SiO_x$) or silicon nitride ($SiN_x$). However, the inventive concepts are not particularly limited to the material of the first cover layer 430.

Figure 19A:
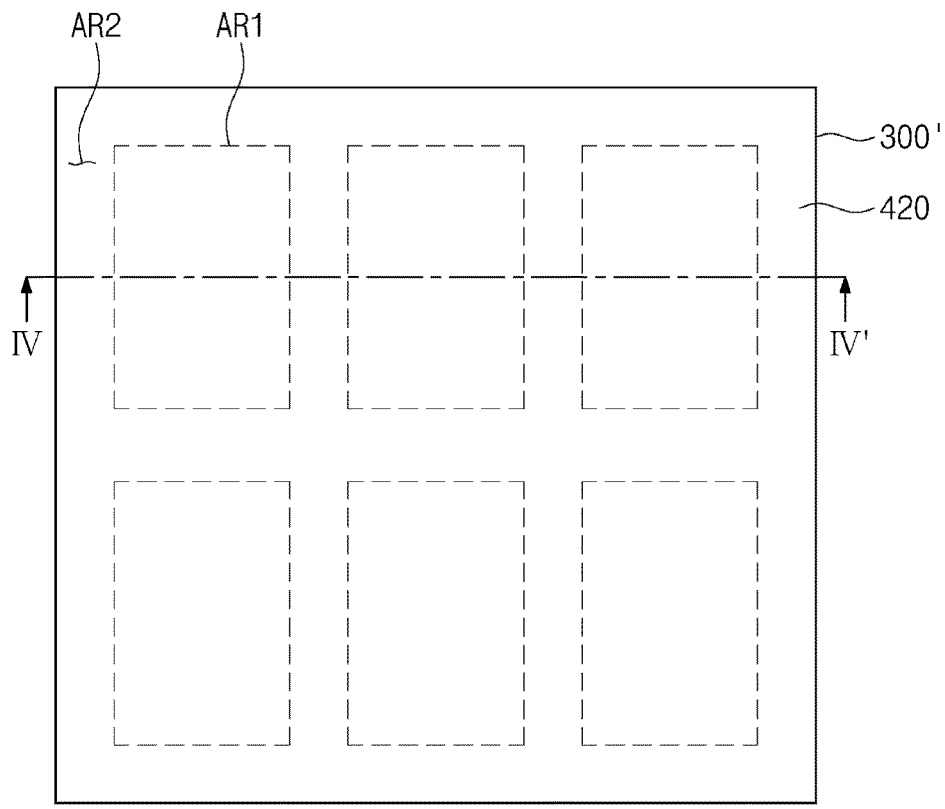
Figure 19A:
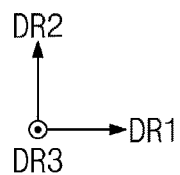
Figure 19B:
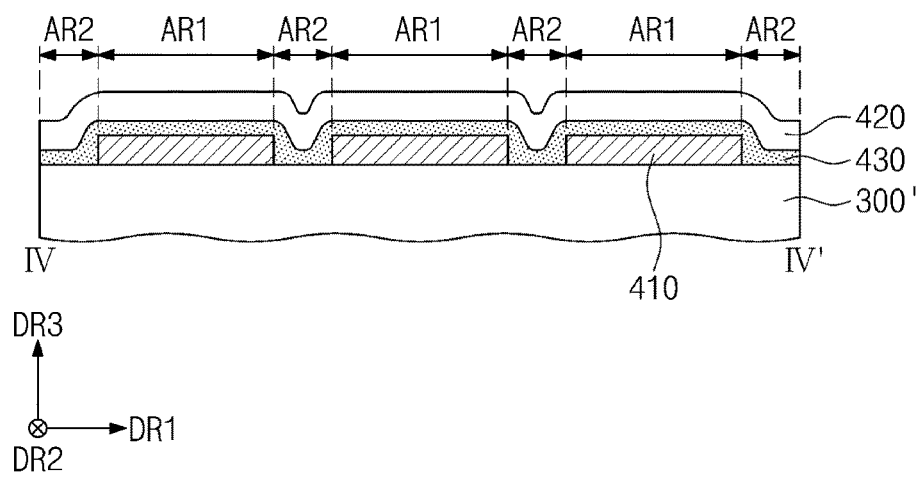

As illustrated in FIG. 19A and FIG. 19B, on the first cover layer 430, the light conversion layer 420 is formed by a process S3. The light conversion layer 420 overlaps the first cover layer 430 entirely. The light conversion layer 420 includes the plurality of light conversion particles QD1 and QD2. As an example, the light conversion particles QD1 and QD2 may be quantum dots.

Figure 20A:
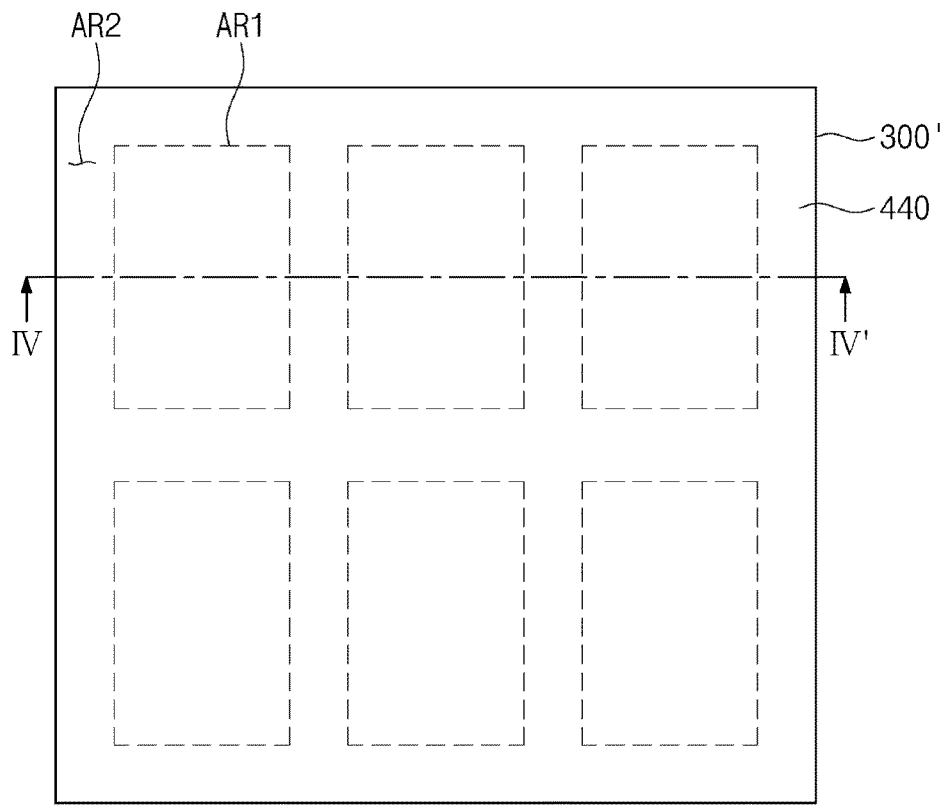
Figure 20A:
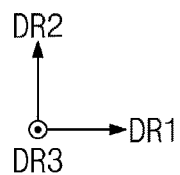
Figure 20B:
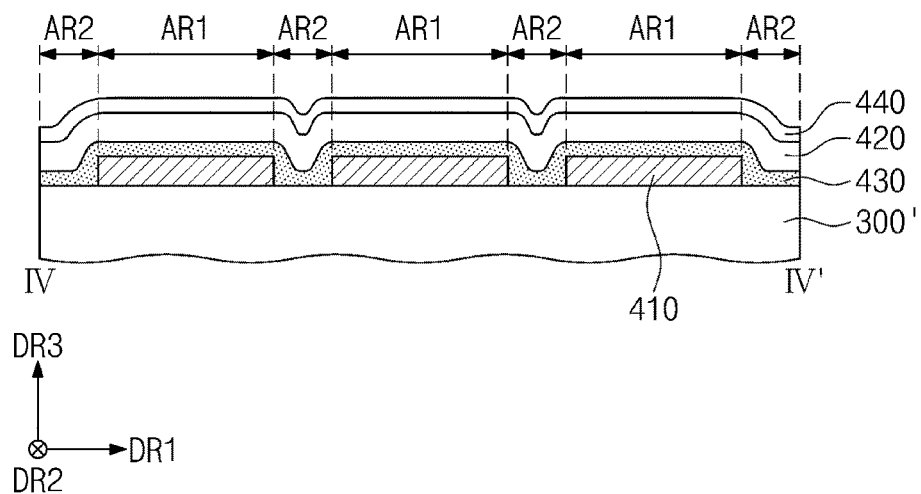

As illustrated in FIG. 20A and FIG. 20B, on the light conversion layer 420, the second cover layer 440 is formed by a process S4. The second cover layer 440 overlaps light conversion layer 420 entirely. The second cover layer 440 may include an inorganic material. As an example, the second cover layer 440 may include silicon oxide ($SiO_x$) or silicon nitride ($SiN_x$). However, the inventive concepts are not particularly limited to the material of the second cover layer 440.

Figure 21A:
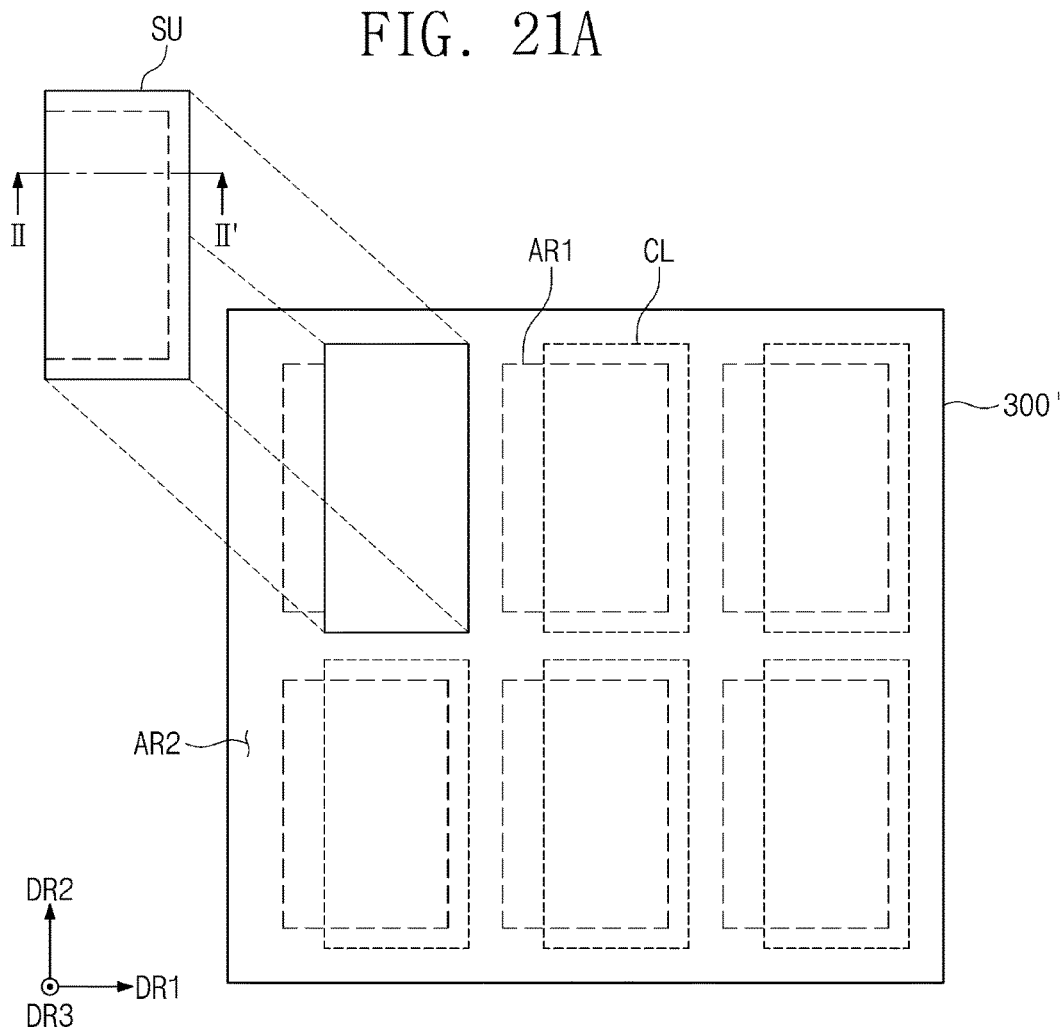

Thereafter, as illustrated in FIG. 21A, the mother substrate 300' is cut along a plurality of cutting lines CL defined on the mother substrate 300' by a process S5. By cutting the mother substrate 300', a plurality of unit substrates SU may be manufactured. Each of the cutting lines CL may have a shape of a closed curve on the mother substrate 300'. As an example, the cutting lines CL have a shape of a rectangle on a plane.

According to an exemplary embodiment, each of the cutting lines CL partially overlaps the first regions AR1. Specifically, each of the cutting lines CL includes a first portion and a second portion. The first portion is disposed on the outside of the first regions AR1, and the second portion may overlap the first regions AR1.

By one side surface of the unit substrates SU cut by the second portion of the cutting lines CL, the low refraction layer 410 and the light conversion layer 420 may be exposed to the outside. Of side surfaces of the unit substrates SU, the rest of the side surfaces cut by the first portion of the cutting lines CL do not expose the low refraction layer 410 and the light conversion layer 420.

Figure 21B:
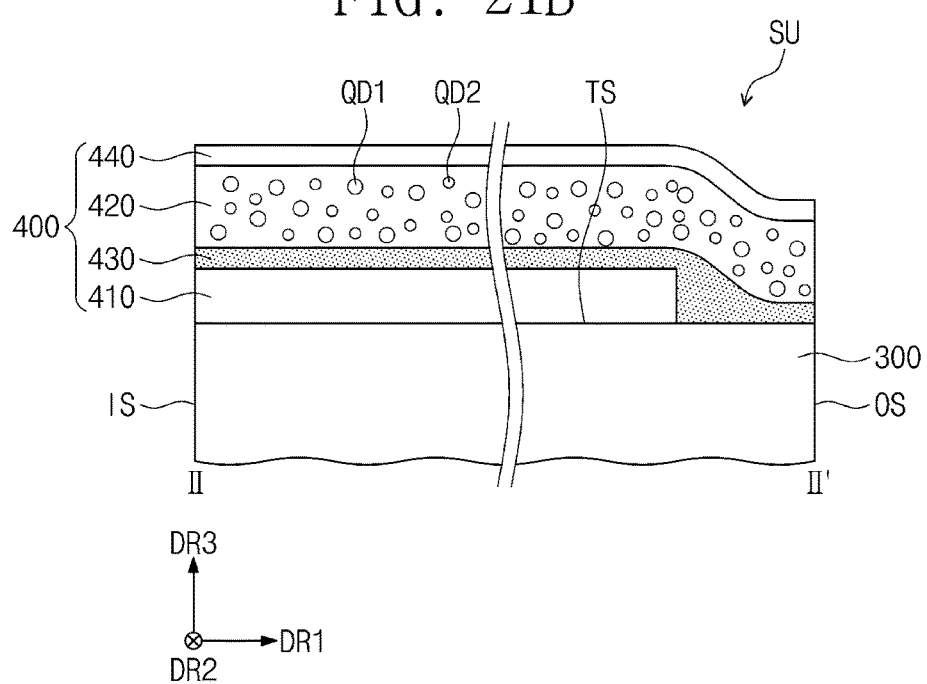

FIG. 21B exemplarily illustrates one of the cut unit substrates SU, which has the same shape as that of FIG. 5 described above. That is, one side of the unit substrates SU cut by the second portion of the cutting lines CL may be disposed to be adjacent to the light source LS.

Figure 22:
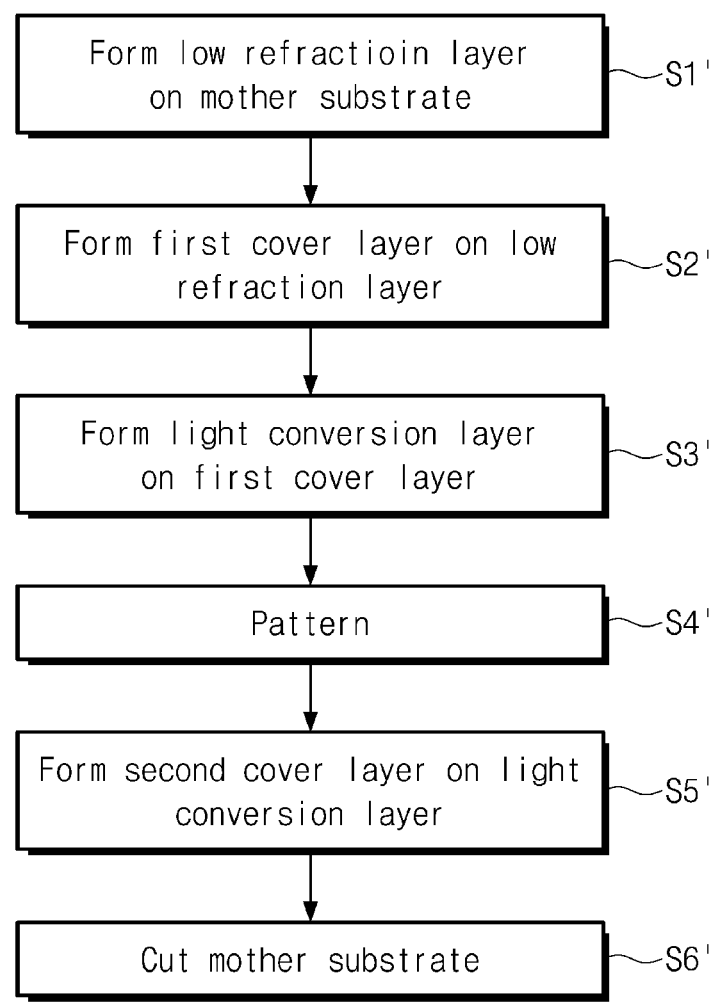
FIG. 22 is a flow chart of a manufacturing method of an optical member according to an exemplary embodiment.

FIG. 22 is a flow chart of a manufacturing method of an optical member according to an exemplary embodiment. FIG. 23A to FIG. 23E and FIG. 24 are views illustrating a manufacturing method of the optical member shown in FIG. 22 according to an exemplary embodiment.

For convenience of explanation, differences from the previous exemplary embodiments will be mainly described, and for a description of the omitted parts, reference can be found in the previous exemplary embodiments. In addition, the constituent elements described above are denoted by the same reference numerals, and redundant description of the constituent elements is omitted.

Hereinafter, referring to FIG. 22 together with FIG. 23A to FIG. 23E, a manufacturing method of an optical member according to another exemplary embodiment will be described.

Figure 23A:
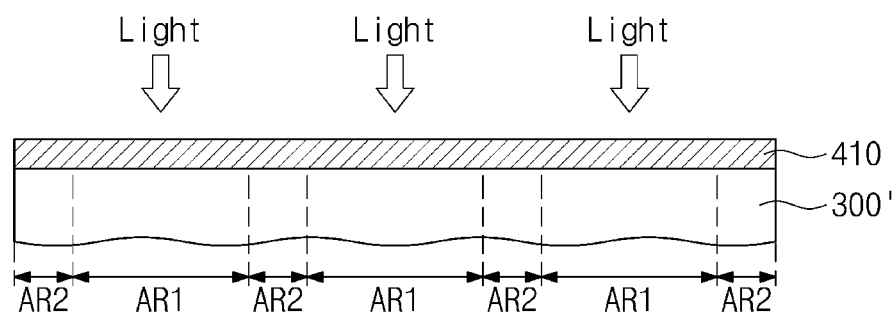
FIGS. 23A, 23B, 23C, 23D, 23E, and 24 are views illustrating a manufacturing method of the optical member shown in FIG. 22 according to an exemplary embodiment.
Figure 23A:
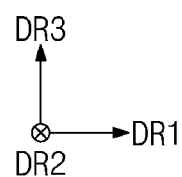

After the mother substrate 300' is prepared, as illustrated in FIG. 23A, the low refraction layer 410 is formed by a process S1'. At this time, the low refraction layer 410 is not patterned. That is, the low refraction layer 410 may be disposed on the mother substrate 300' entirely.

Figure 23B:
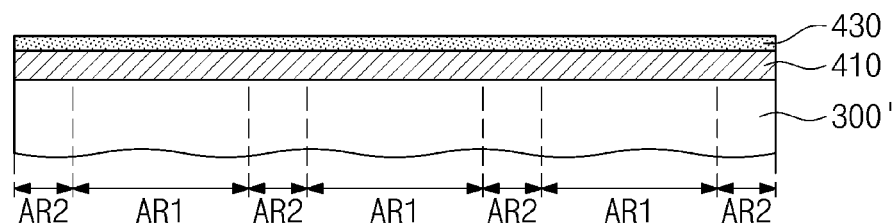
Figure 23B:
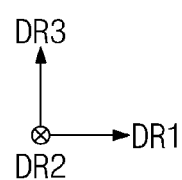

Thereafter, as illustrated in FIG. 23B, on the low refraction layer 410, the first cover layer 430 is formed by a process S2'. The first cover layer 430 includes an inorganic material. The first cover layer 430 may be formed through a deposition process. The first cover layer 430 is disposed on the low refraction layer 410 entirely.

Figure 23C:
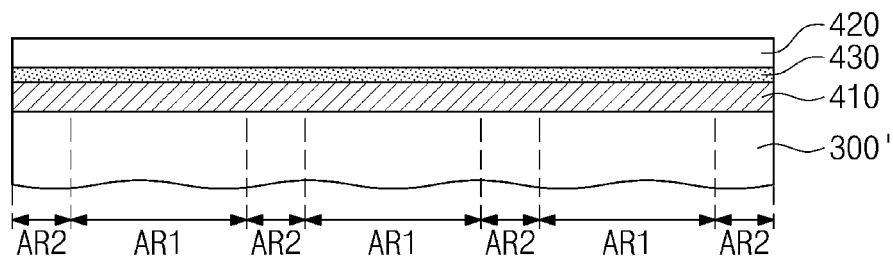
Figure 23C:
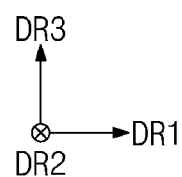

Thereafter, as illustrated in FIG. 23C, on the first cover layer 430, the light conversion layer 420 is formed by a process S3'. The light conversion layer 420 overlaps the first cover layer 430 entirely.

Figure 23D:
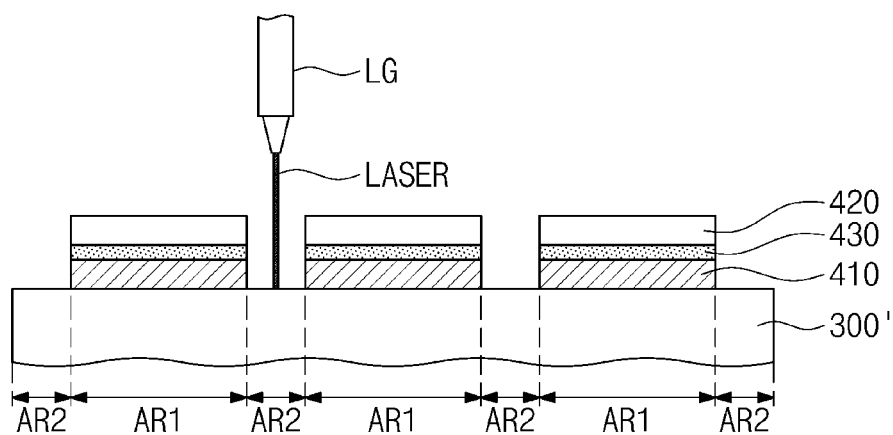
Figure 23D:
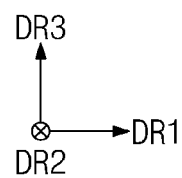

Thereafter, as illustrated in FIG. 23D, a laminated body having the low refraction layer 410, the first cover layer 430, and the light conversion layer 420 sequentially laminated thereon is patterned by a process S4'. According to an exemplary embodiment, the laminated body may be patterned by a laser process. Specifically, laser generated by the laser generator LG is irradiated on the second region AR2. Accordingly, a portion of the laminated body corresponding to the second region AR2 may be removed. That is, the laminated body may be disposed only on the first regions AR1 on the mother substrate 300'.

Figure 23E:
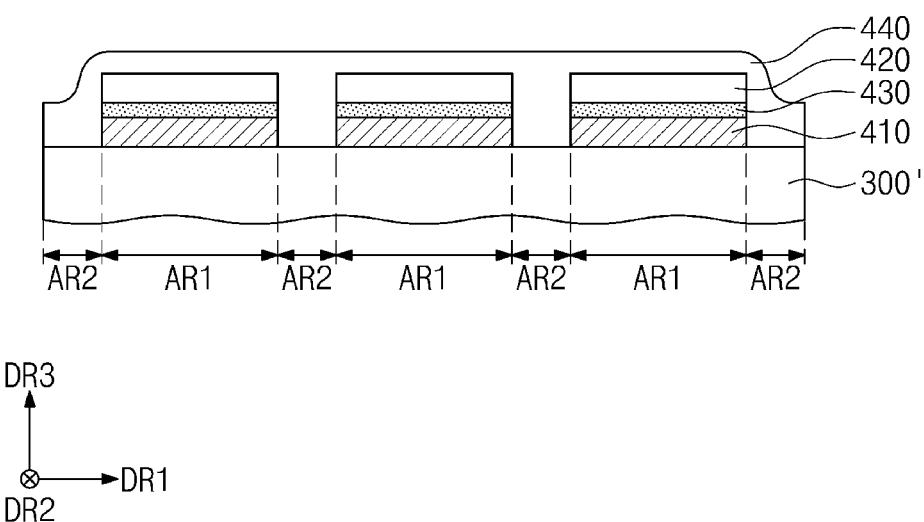

Thereafter, as illustrated in FIG. 23E, on the laminated body, the second cover layer 440 is formed by a process S5'. The second cover layer 440 may include an inorganic material. The second cover layer 440 overlaps the entire region of the mother substrate 300'. That is, the second cover layer 440 may cover side surfaces of a pattern of the laminated body disposed on each of the first regions AR1.

Thereafter, the mother substrate 300' is cut by a process S6'. The process of cutting the mother substrate 300' according to an exemplary embodiment is the same as the process described above with reference to FIG. 21A, and therefore, the description thereof is omitted.

Figure 24:
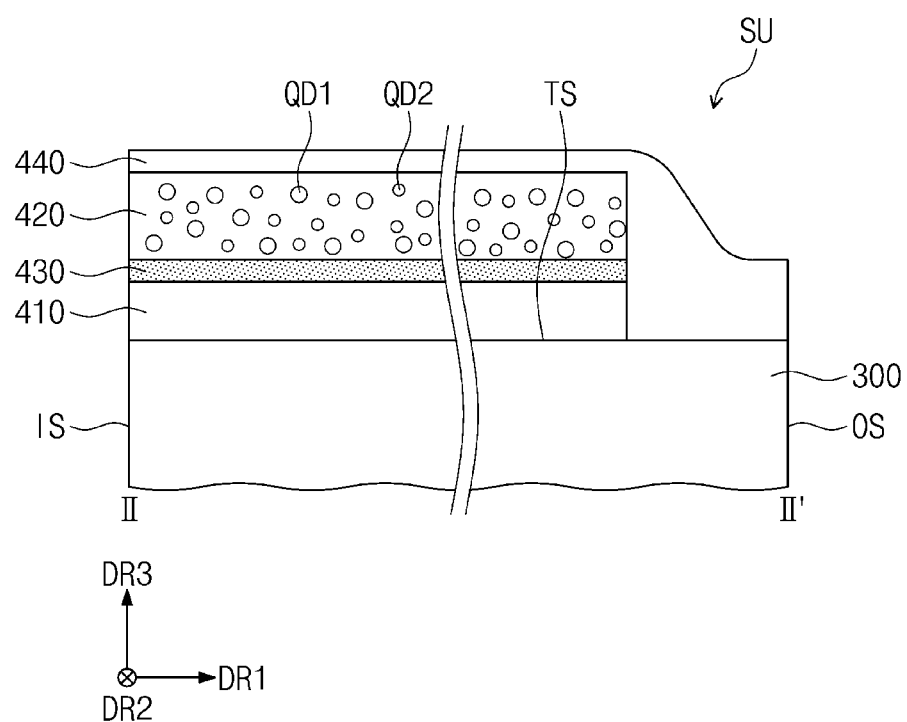

FIG. 24 exemplarily illustrates one of the unit substrates cut according to an exemplary embodiment. When the first cover layer 430 and the second cover layer 440 are made of the same material, the unit substrate illustrated in FIG. 24 has the same shape as that of the optical member 400-5 (FIG. 12) illustrated in FIG. 12.

According to an exemplary embodiment, since not only the upper surface, but also side surfaces of the light conversion layer 420 are covered, the light conversion layer 420 may be more effectively protected.

The inventive concepts have high industrial applicability in that durability and display quality of a display device are improved.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

The invention claimed is:
1. A display apparatus comprising:
a light source configured to generate light;
a display panel configured to display images;
a light guide member comprising-at least one surface adjacent to the light source; and
an optical member-between the light guide member and the display panel,
wherein:
the optical member comprises:
a low refraction layer-on a light output-surface of the light guide member and comprising-side surfaces;
a first cover layer-on the low refraction layer and surrounding at least a portion of the side surfaces of the low refraction layer; and
a light conversion layer-on the first cover layer, the light conversion layer being configured to convert a-wavelength band of-incident light; and the first cover layer comprises:
- a barrier layer-on an upper portion of the low refraction layer and comprising an inorganic material; and
- an adhesive layer-between the low refraction layer and the barrier layer, the adhesive layer increasing adhesion between the low refraction layer and the barrier layer.

2. The display apparatus of claim 1, wherein:
the barrier layer contacts an upper surface of the low refraction layer; and
the adhesive layer contacts-at least a portion of the-side surfaces of the low refraction layer.

3. The display apparatus of claim 1, wherein the barrier layer comprises at least one of silicon oxide ($SiO_x$) and silicon nitride ($SiN_x$).

4. The display apparatus of claim 1, wherein the first cover layer covers some of the side surfaces of the low refraction layer, except for a side surface adjacent to the light source.

5. The display apparatus of claim 1, wherein the first cover layer covers all of the side surfaces of the low refraction layer.

6. The display apparatus of claim 1, wherein the optical member further comprises a second cover layer on the light conversion layer and covering the light conversion layer.

7. The display apparatus of claim 6, wherein the second cover layer comprises a same material as the first cover layer.

8. The display apparatus of claim 6, wherein the second cover layer covers at least a portion of side surfaces of the light conversion layer.

9. The display apparatus of claim 8, wherein the optical member further comprises a third cover layer-on the second cover layer and comprising an organic material.

10. The display apparatus of claim 1, wherein the light conversion layer comprises quantum dots.

11. The display apparatus of claim 1, wherein the low refraction layer comprises pores.

12. The display apparatus of claim 1, wherein the refractive index of the low refraction layer is greater than or equal to about 1.1 and less than or equal to about 1.3.

13. A backlight unit comprising:
a light source configured to generate light;
a light guide member comprising at least one surface adjacent to the light source; and
an optical member on the light guide member,
wherein:
the optical member comprises:
- a low refraction layer on a light output surface of the light guide member and comprising side surfaces;
- a first cover layer on the low refraction layer and surrounding at least a portion of the side surfaces of the low refraction layer; and
- a light conversion layer on the first cover layer, the light conversion layer being configured to cover a wavelength band of incident light; and the first cover layer comprises:
- a barrier layer-on an upper portion of the low refraction layer and comprising an inorganic material; and
- an adhesive layer-between the low refraction layer and the barrier layer, the adhesive layer increasing adhesion between the low refraction layer and the barrier layer.

* * * * *